US012660242B2

(12) United States Patent
Wu et al.

(10) Patent No.: US 12,660,242 B2
(45) Date of Patent: Jun. 16, 2026

(54) MULTIGATE DEVICE STRUCTURE WITH STEPWISE ISOLATION FEATURES AND METHOD MAKING THE SAME

(71) Applicant: Taiwan Semiconductor Manufacturing Company, Ltd., Hsin-Chu (TW)

(72) Inventors: Ming-Yuan Wu, Hsinchu City (TW); Min Jiao, Taichung City (TW); Da-Wen Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 965 days.

(21) Appl. No.: 17/832,587

(22) Filed: Jun. 4, 2022

(65) Prior Publication Data

US 2023/0137528 A1     May 4, 2023

Related U.S. Application Data

(60) Provisional application No. 63/275,498, filed on Nov. 4, 2021.

(51) Int. Cl.
H10D 30/67 (2025.01)
H10B 10/00 (2023.01)
(Continued)

(52) U.S. Cl.
CPC ....... H10D 30/6735 (2025.01); H10B 10/125 (2023.02); H10D 30/6713 (2025.01);
(Continued)

(58) Field of Classification Search
CPC ........... H10D 30/6735; H10D 30/6713; H10D 30/6733; H10D 30/6757; H10D 62/115; H10D 64/017; H10D 84/0128; H10D 84/013; H10D 84/0151; H10D 84/038; H10D 30/797; H10D 30/014; H10D 30/43; H10D 62/121; H10D 84/83; H10D 62/364;
(Continued)

(56) References Cited

U.S. PATENT DOCUMENTS

2020/0051976 A1* 2/2020 Ha ........................ H10D 64/017
2021/0280683 A1* 9/2021 Trivedi .............. H10D 30/6735

FOREIGN PATENT DOCUMENTS

CN     108109994 A     6/2018
CN     108122911 A     6/2018

* cited by examiner

*Primary Examiner* — Fernando L Toledo
*Assistant Examiner* — Jorge Andres Lopez
(74) *Attorney, Agent, or Firm* — HAYNES AND BOONE, LLP

(57) ABSTRACT

The present disclosure provides a method that includes providing a substrate including a first circuit region and a second circuit region; forming a semiconductor stack on the substrate, wherein the semiconductor stack includes first semiconductor layers of a first composition and second semiconductor layers of a second composition alternatively stacked on the substrate; performing a first patterning process to the semiconductor stack and the substrate to form first trenches having a first depth; and performing a second patterning process to the semiconductor stack and the substrate, thereby forming second trenches of a second depth in the first circuit region and third trenches of a third depth in the second circuit region, the third depth being less than the second depth.

20 Claims, 23 Drawing Sheets

(51) Int. Cl.
     *H10D 62/10*          (2025.01)
     *H10D 64/01*          (2025.01)
     *H10D 84/01*          (2025.01)
     *H10D 84/03*          (2025.01)

(52) U.S. Cl.
     CPC ..... *H10D 30/6733* (2025.01); *H10D 30/6757*
          (2025.01); *H10D 62/115* (2025.01); *H10D*
          *64/017* (2025.01); *H10D 84/0128* (2025.01);
               *H10D 84/013* (2025.01); *H10D 84/0151*
                    (2025.01); *H10D 84/038* (2025.01)

(58) Field of Classification Search
     CPC .. H10D 62/822; H10D 64/667; H10B 10/125;
               H10B 10/12; H10B 10/18; B82Y 10/00
     See application file for complete search history.

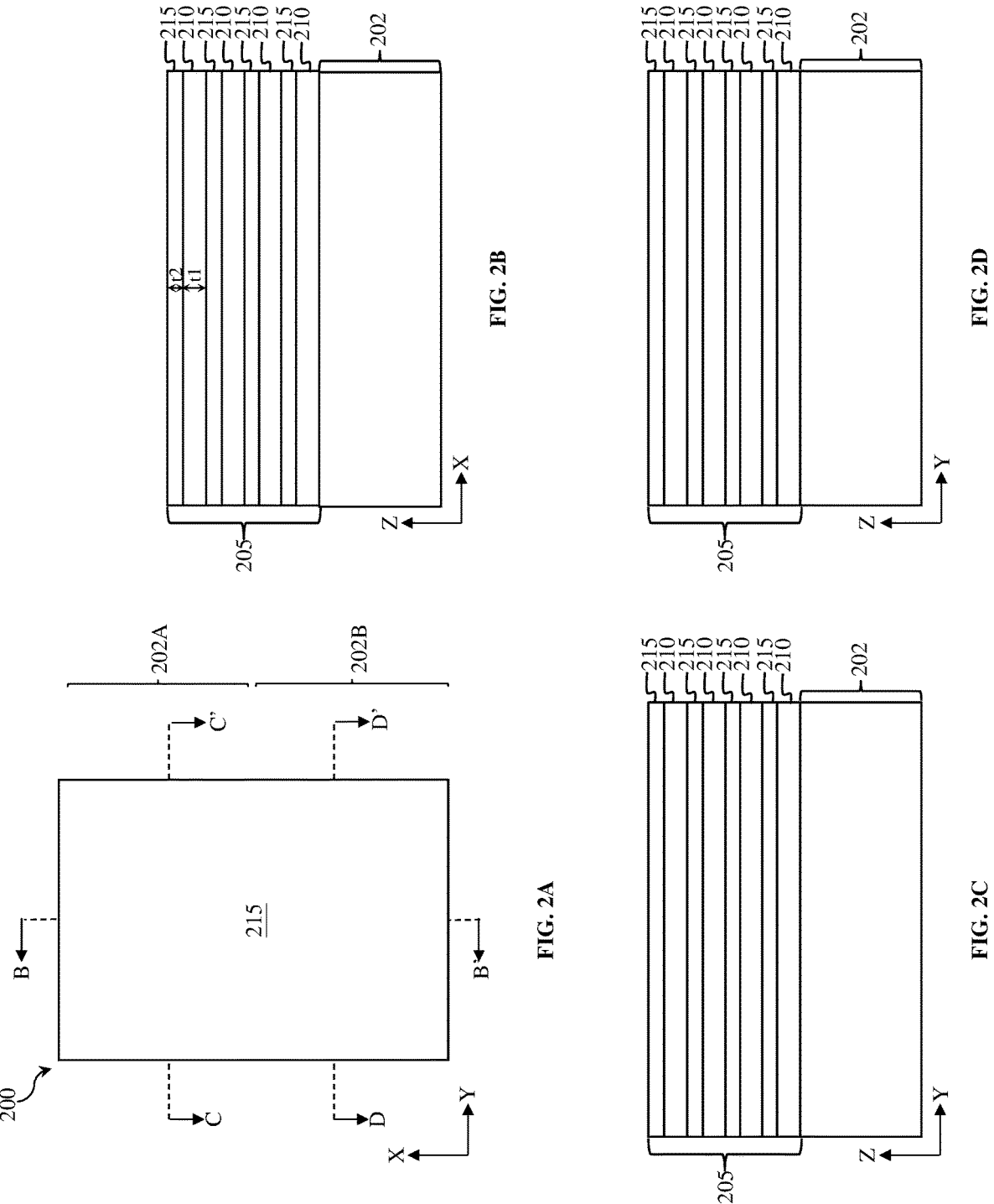

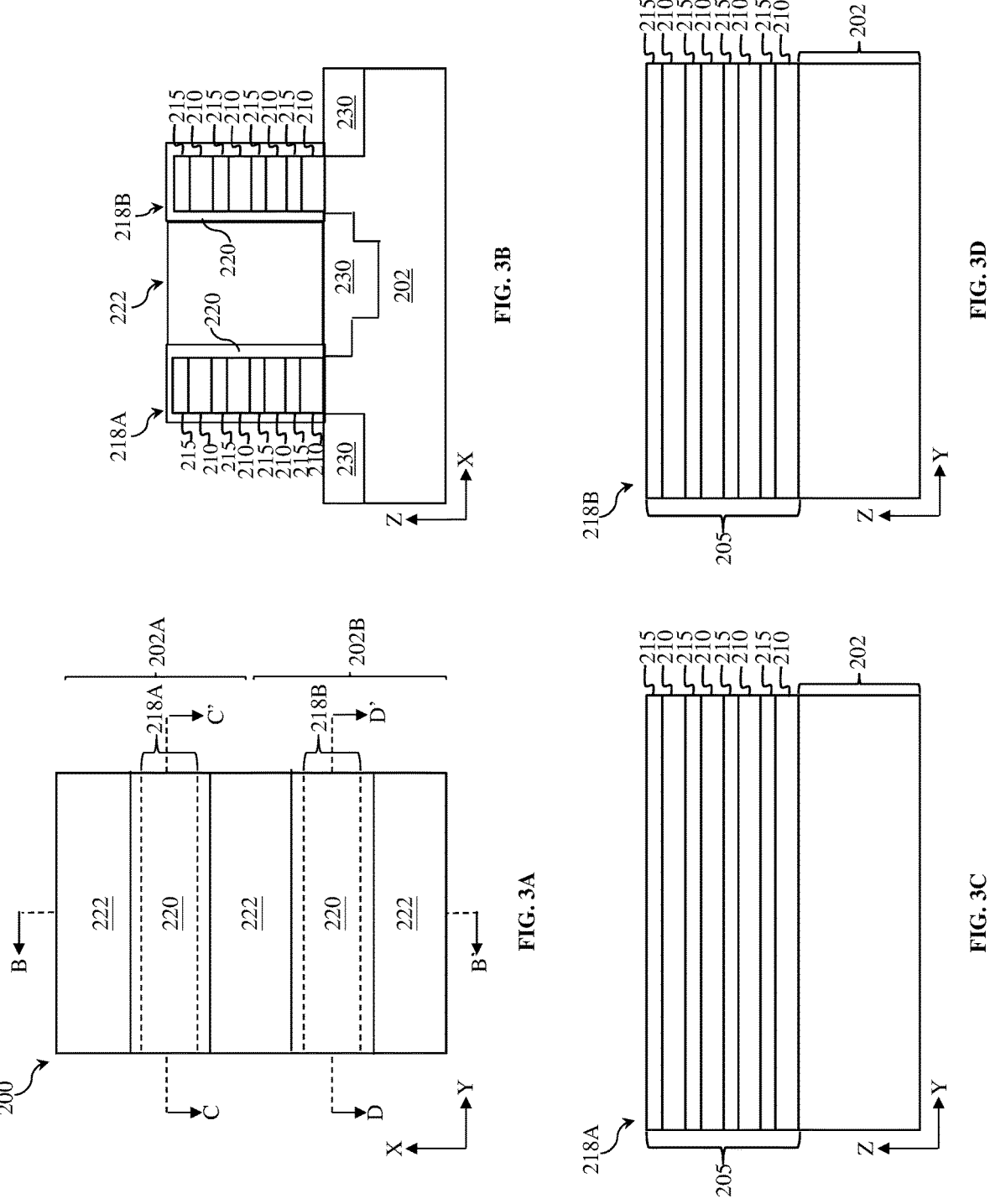

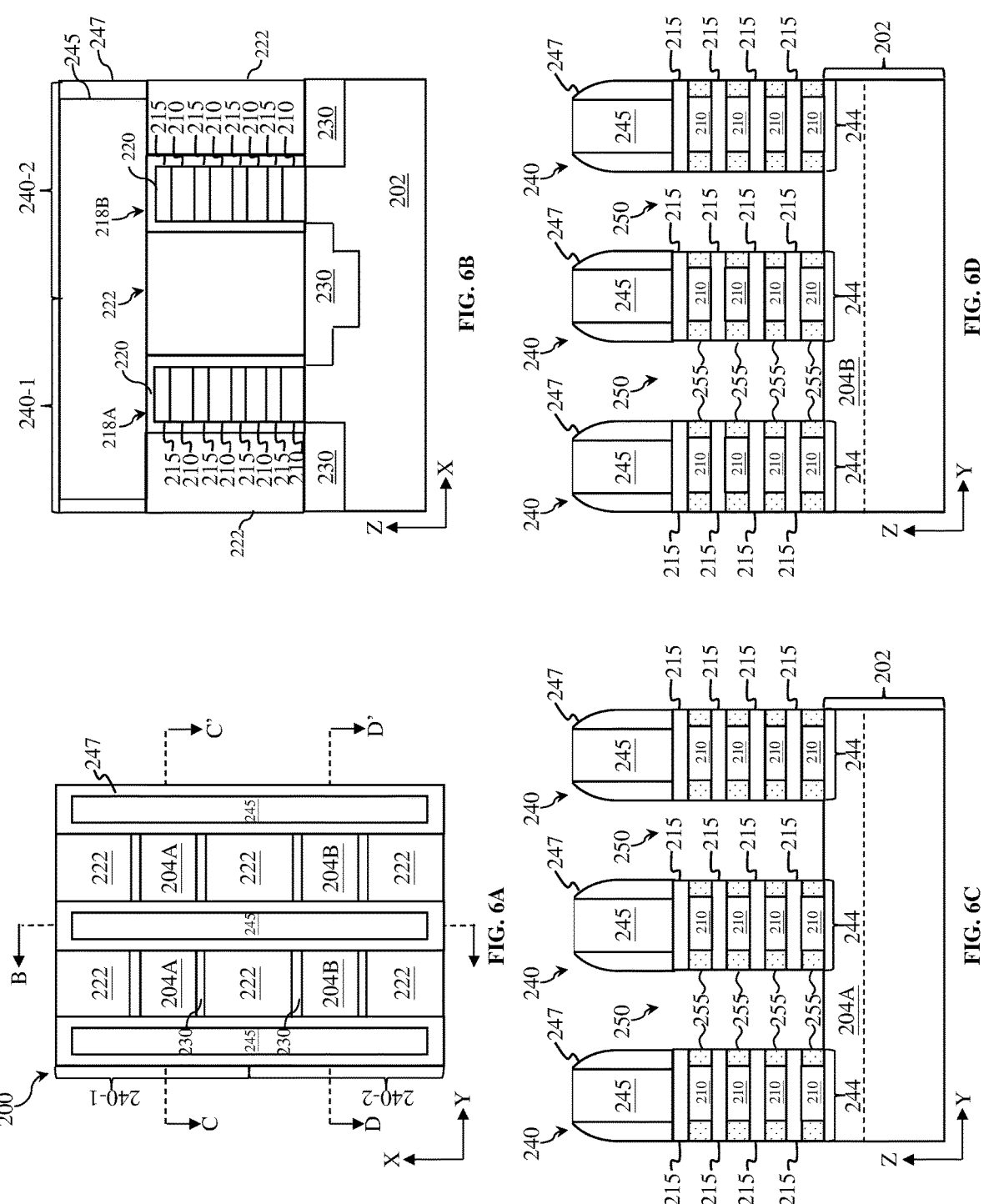

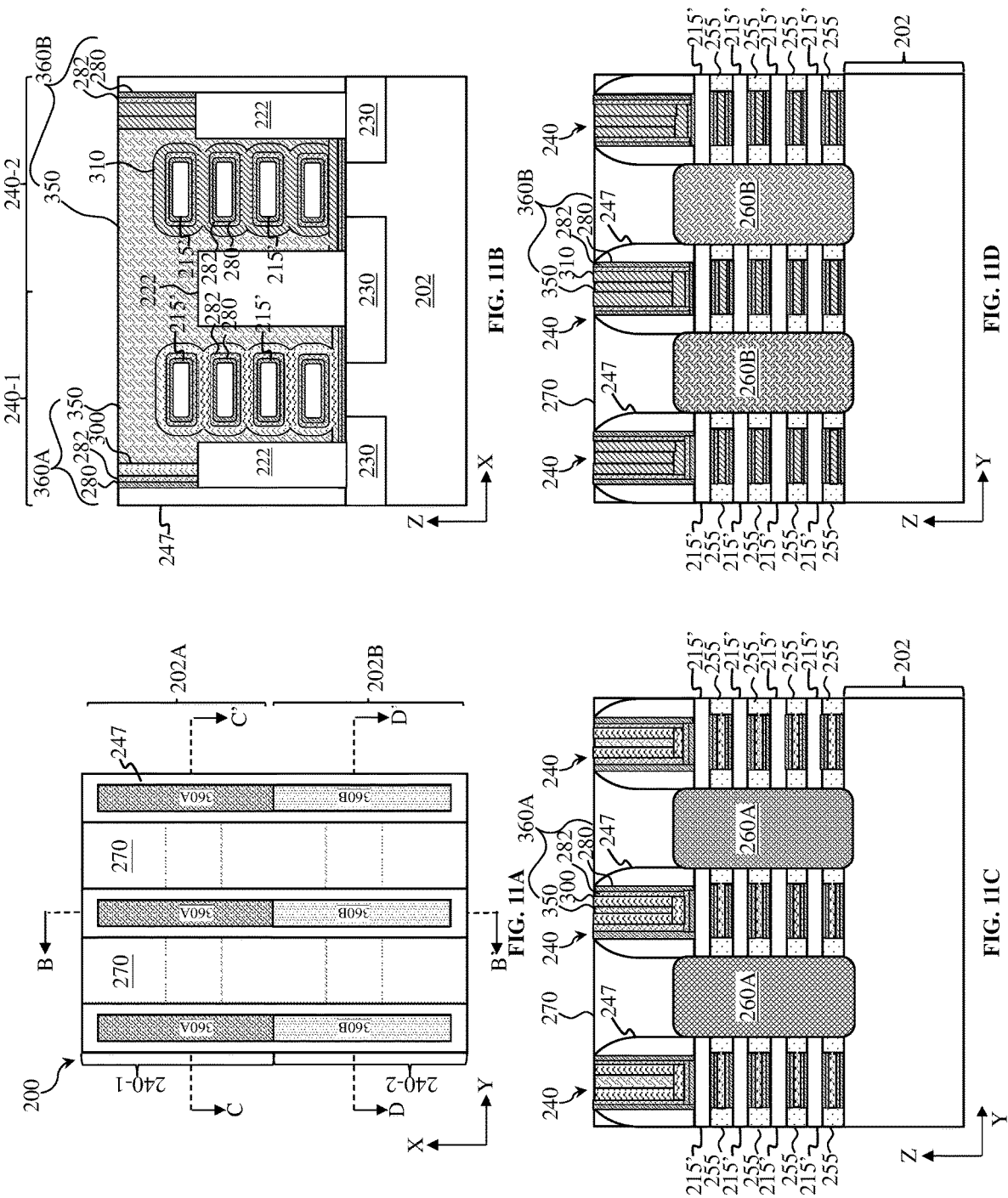

MULTIGATE DEVICE STRUCTURE WITH STEPWISE ISOLATION FEATURES AND METHOD MAKING THE SAME

This application claims priority to U.S. Provisional Patent Application Ser. No. 63/275,498 filed Nov. 4, 2021, the entire disclosure of which is hereby incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when fabricating a gate structure for a GAA device, which challenges have been observed to degrade GAA device performance and increase GAA processing complexity. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-11A, FIGS. 2B-11B, FIGS. 2C-11C, and FIGS. 2D-11D are fragmentary diagrammatic views of a multigate device, in portion or entirety, at various fabrication stages (such as those associated with the method in FIG. 1) according to various aspects of the present disclosure.

DETAILED DESCRIPTION

Figure 1:
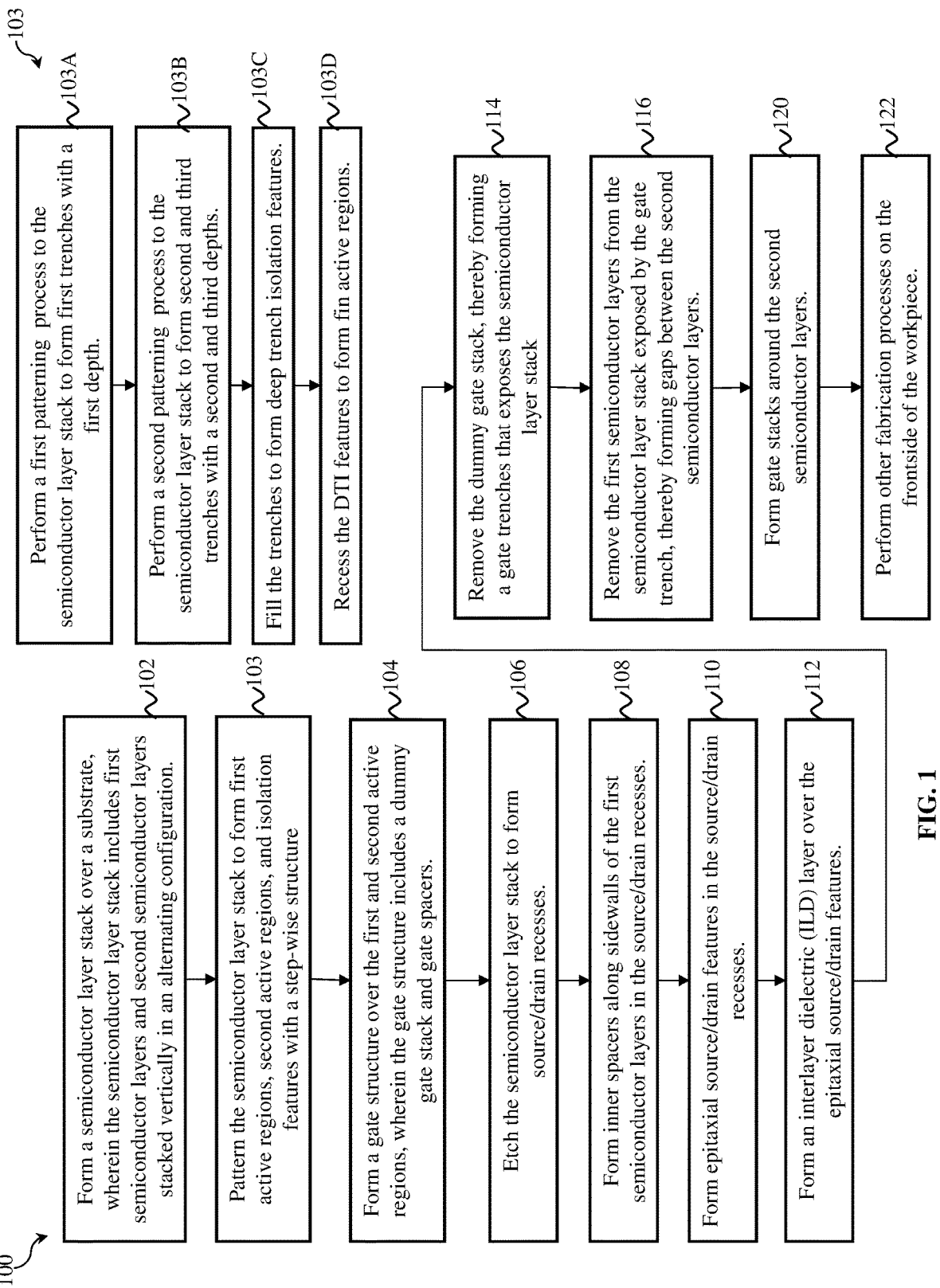
FIG. 1 is a flowchart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for case of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

FIG. 1 illustrates a flowchart of a method 100 for fabricating a multi-gate device according to various aspects of the present disclosure. In some embodiments, method 100 fabricates a multi-gate device that includes p-type GAA transistors and n-type GAA transistors. In some embodiments, method 100 fabricates a multi-gate device that includes first GAA transistors and second GAA transistors with different characteristics, such as different functions (e.g., logic device or memory device) or different conductivity type (e.g., n-type transistor or p-type transistor). In the disclosed structure and the method making the same, device structure, especially profiles of source/drain (S/D) features, are designed differently to optimize respective device performance, including reduced parasitic capacitance and reduced contact resistance. Particularly, the GAA transistors include S/D features with a bar-like profile or lollipop-like profile for and adjacent airgap to collectively reduce the parasitic capacitance and the contact resistance according to various embodiments.

In some embodiments, method 100 fabricates a multi-gate device that includes p-type GAA transistors and n-type GAA transistors. At block 102, a semiconductor layer stack is formed over a substrate. The semiconductor layer stack includes first semiconductor layers and second semiconductor layers stacked vertically in an alternating configuration. In some embodiments, the operation 102 includes depositing various semiconductor materials (such as alternatively silicon and silicon germanium) by epitaxial growth. In some embodiments, doped wells, such as n-type doped wells and p-type doped wells are formed by ion implantations before the formation of the semiconductor stack. At block 103, the semiconductor stack is patterned to form active regions (also referred to as semiconductor fins or fins); and form isolation features, such as deep trench isolation (DTI) features to isolate fins. Particularly, the substrate includes a logic circuit region and a static random-access memory (SRAM) circuit region; and the block 103 includes multiple operations to form the semiconductor fins and DTI features with a stepwise profile. More specifically, the block 103 includes an operation 103A by performing a first patterning process the semiconductor stack to form first trenches with a first depth; an operation 103B by performing a second patterning process the semiconductor stack to form second trenches with a second depth on the logic circuit region and third trenches with a third depth on the SRAM circuit region; an operation 103C by filling the trenches with one or more dielectric materials to form DTI features by a suitable procedure that includes deposition and chemical mechanical polishing (CMP); and an operation 103D by recessing the DTI features by selective etching to define semiconductor fins. In the second patterning process, the etching duty ratio of the logic circuit region is greater than the etching duty ratio of the SRAM circuit region, resulting in the second depth being greater than the third depth.

A cladding layer may be formed on the sidewalls of the first and second semiconductor layer stacks. In some embodiments, dielectric fins may be formed on the substrate among the fins. Dielectric fins have similar profile as fins but include dielectric material(s) with benefits, such as tuning the fin density. Particularly, the second semiconductor layers in the semiconductor layer stacks are formed with nonuniform composition along the vertical direction (thickness direction). At block 104, a gate structure is formed over the semiconductor layer stack. The gate structure includes a dummy gate stack and gate spacers. A lightly doped drain (LDD) implantation may be implemented, and the cladding layer may be anisotropically etched to remove the portions disposed on the DTI features and on the top surfaces of the semiconductor fins. The anisotropic etch, such as plasma etch, to the cladding layer may be implemented between the formation of the dummy gate stack and the gate spacers. At block 106, portions of the semiconductor layer stack are removed to form source/drain recesses. At block 108, inner spacers are formed along sidewalls of the first semiconductor layers in the semiconductor layer stack. At block 110, epitaxial source/drain (S/D) features are formed in the source/drain recesses. At block 112, an interlayer dielectric (ILD) layer is formed over the epitaxial source/drain features. At block 114, the dummy gate stack is removed, thereby forming a gate trench that expose the semiconductor layer stack. At block 116, the first semiconductor layers are removed from the semiconductor layer stack exposed by the gate trenches, thereby forming gaps between the second semiconductor layers. At block 120, gate stacks are formed in the gate trenches around the second semiconductor layers. At block 122, other fabrication processes, including forming an interconnect structure, are performed on the workpiece. Additional steps can be provided before, during, and after method 100, and some of the steps described can be moved, replaced, or eliminated for additional embodiments of method 100. The discussion that follows illustrates various embodiments of nanowire-based (or nanostructure-based) integrated circuit devices that can be fabricated according to method 100.

FIGS. 2A-11A, FIGS. 2B-11B, FIGS. 2C-11C, and FIGS. 2D-11D are fragmentary diagrammatic views of a multigate device (or a workpiece) 200, in portion or entirety, at various fabrication stages (such as those associated with method 100 in FIG. 1) according to various aspects of the present disclosure. In particular, FIGS. 2A-11A are top views of multigate device 200 in an X-Y plane; FIGS. 2B-11B are diagrammatic cross-sectional views of multigate device 200 in an X-Z plane along lines B-B' respectively of FIGS. 2A-11A, FIGS. 2C-11C are diagrammatic cross-sectional views of multigate device 200 in a Y-Z plane along lines C-C' respectively of FIGS. 2A-11A; and FIGS. 2D-11D are diagrammatic cross-sectional views of multigate device 200 in the Y-Z plane along lines D-D' respectively of FIGS. 2A-11A.

Figure 3F:
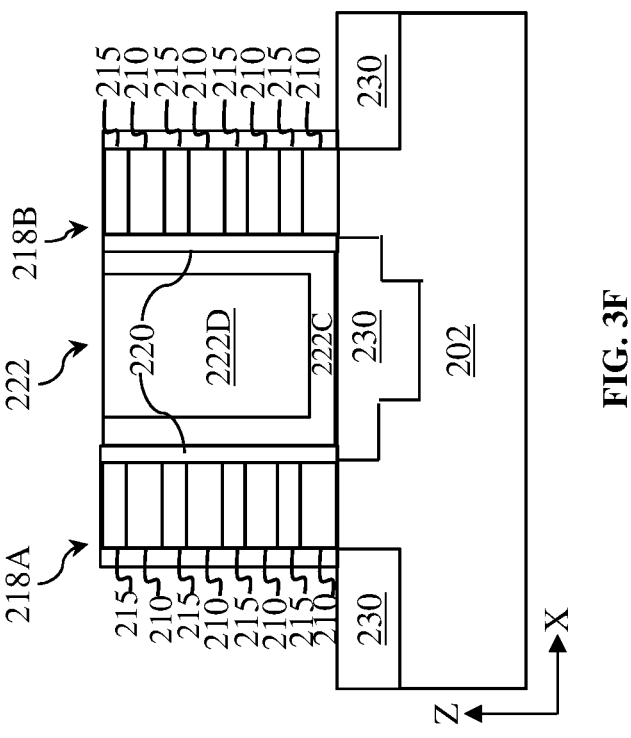
FIGS. 3E and 3F are fragmentary diagrammatic views of the multigate device, in portion or entirety according to various aspects of the present disclosure.
Figure 3E:
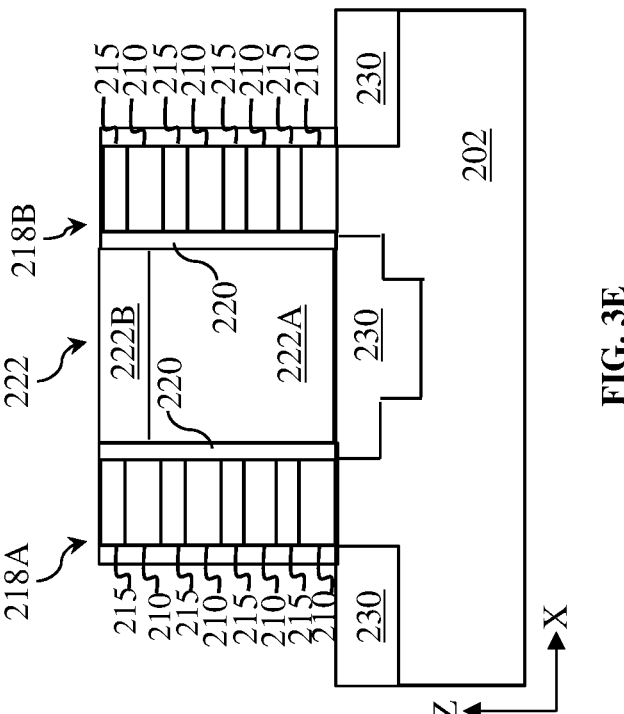
Figures 4A, 4B, 4C, 4D:
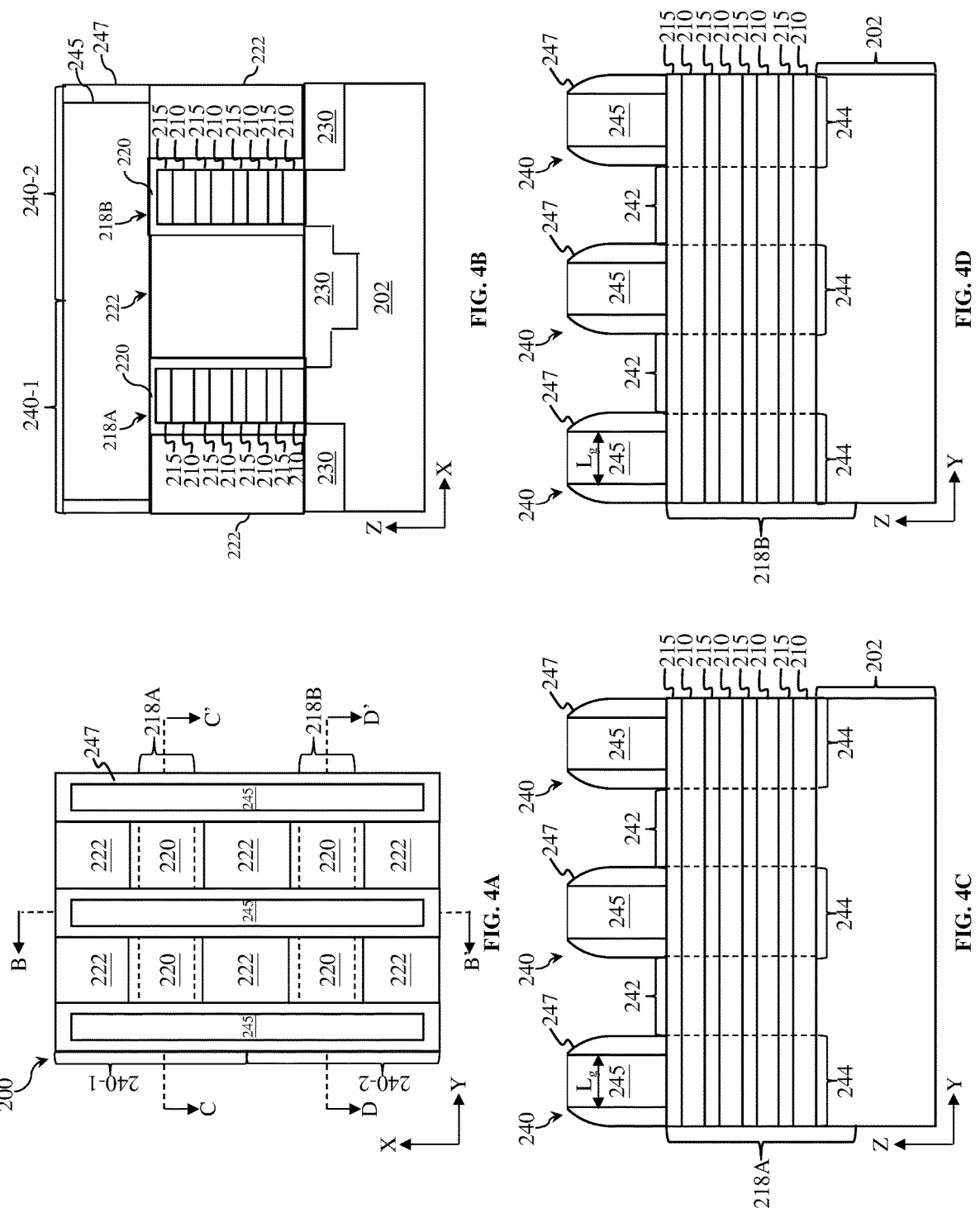
Figures 5A, 5B, 5C, 5D:
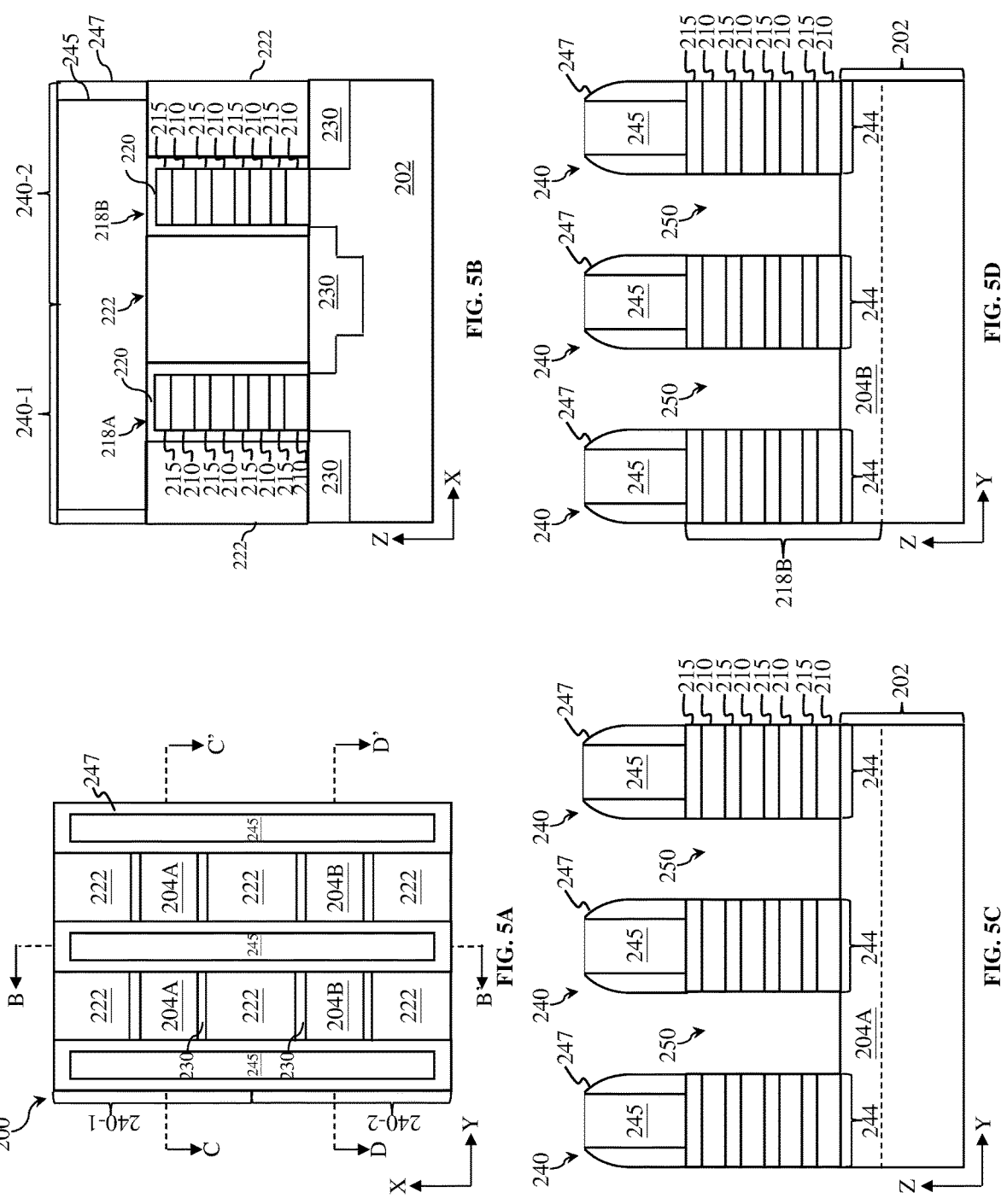
Figures 7A, 7B, 7C, 7D:
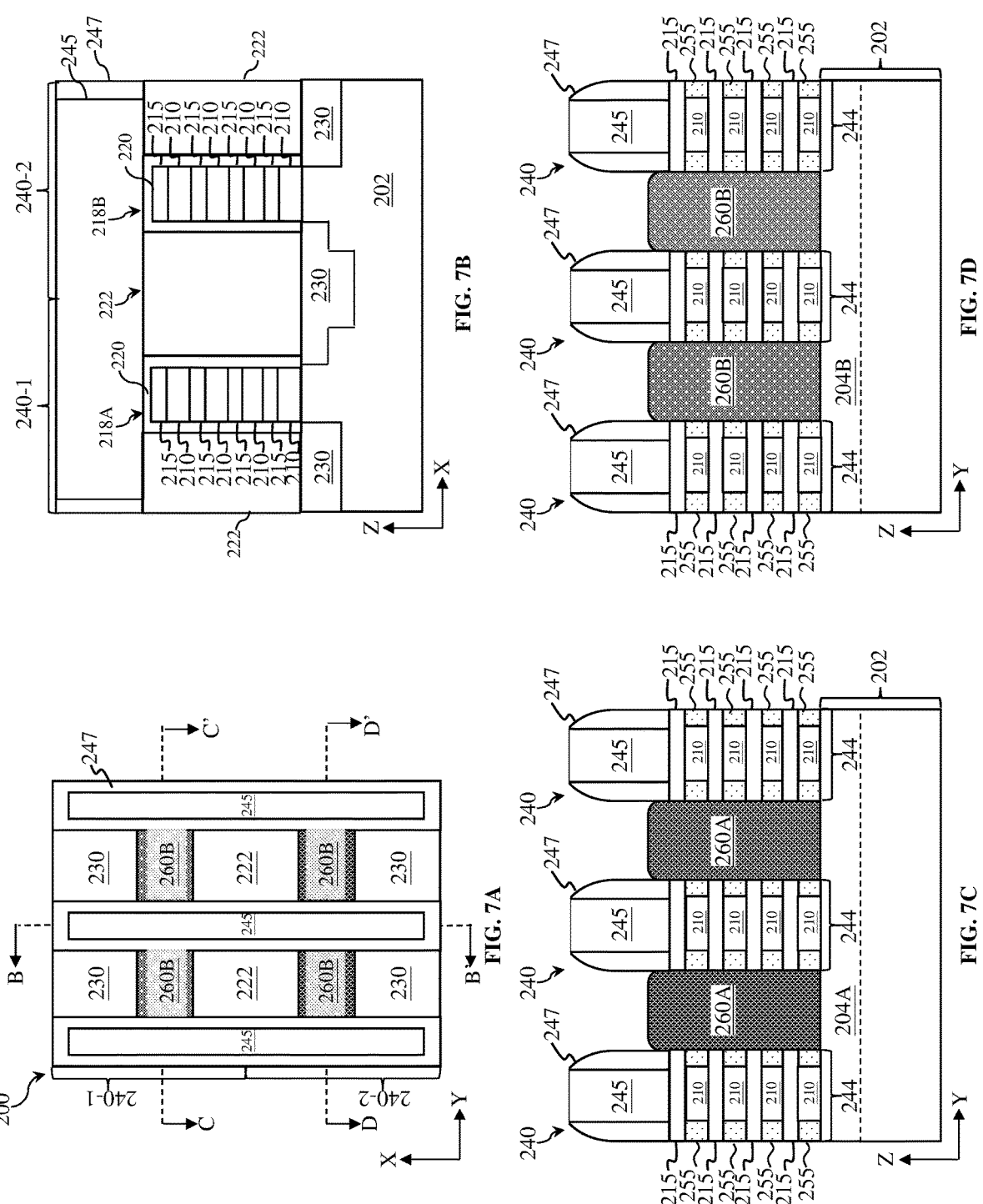
Figures 8A, 8B, 8C, 8D:
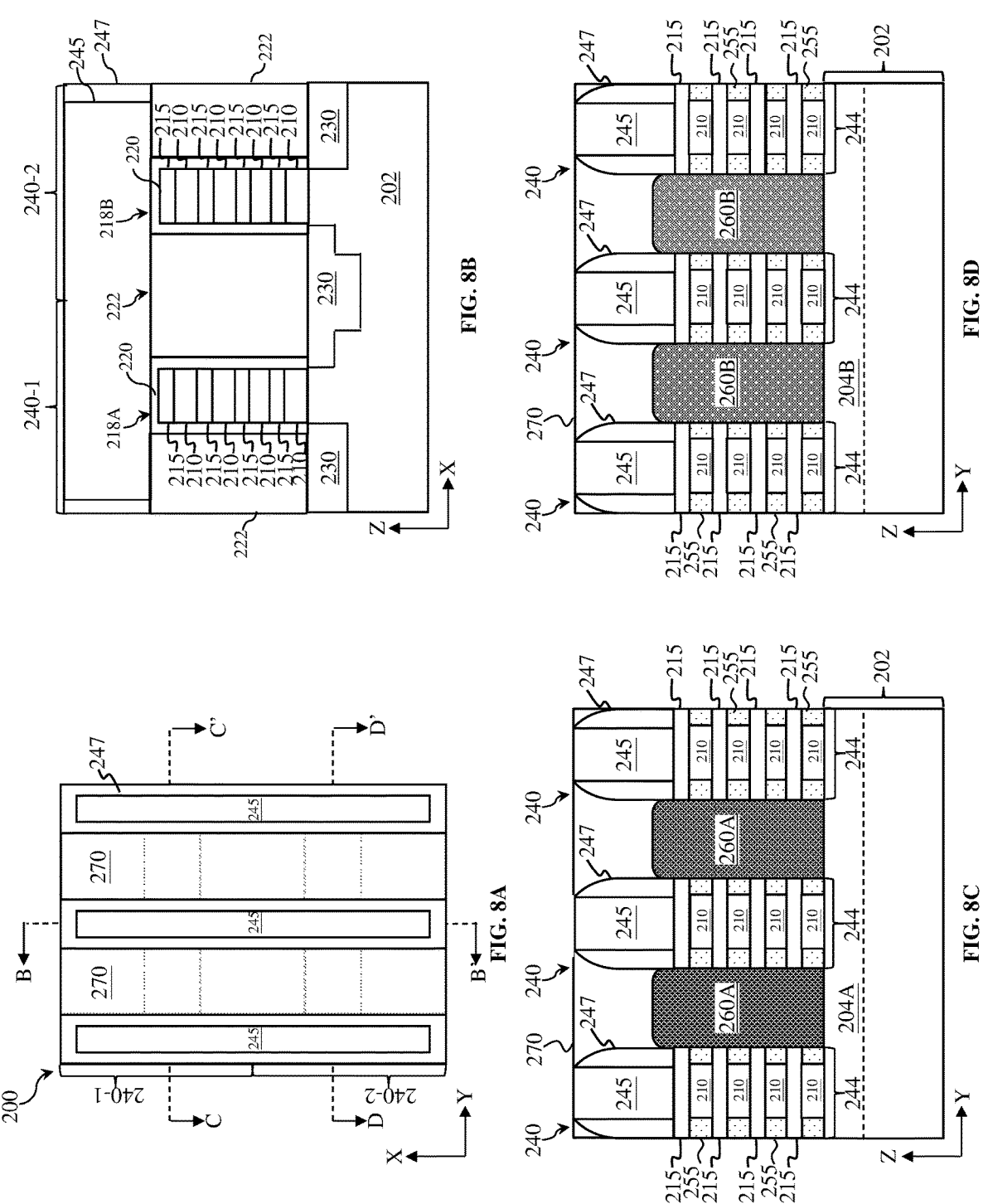
Figures 9A, 9B, 9C, 9D:
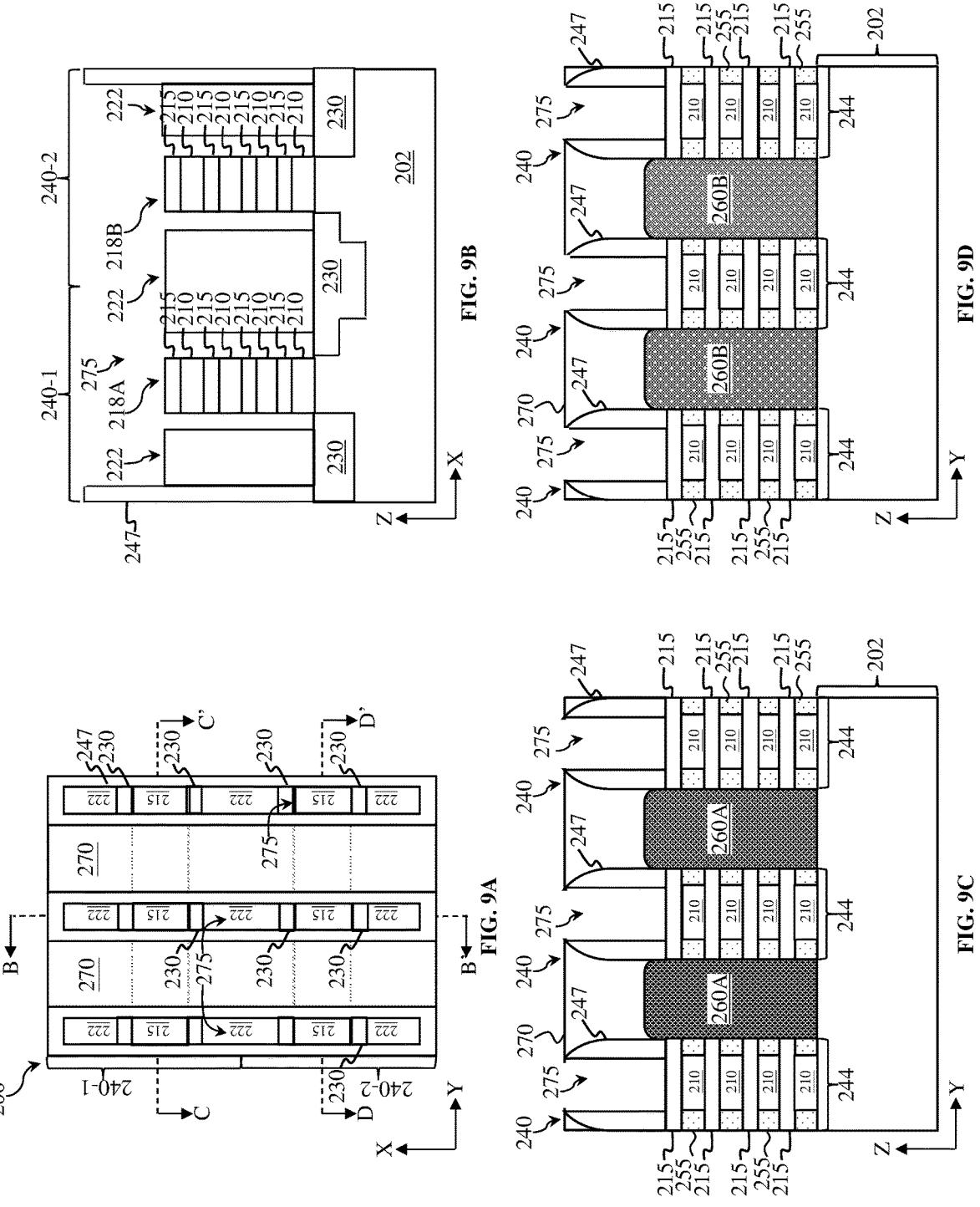

FIG. 3E, and FIG. 3F are fragmentary diagrammatic views of the multigate device 200, in portion or entirety according to various aspects of the present disclosure. In particular, each of FIG. 3E is a diagrammatic cross-sectional view of multigate device 200 in the X-Z plane along lines C-C' of FIG. 3A constructed according to various embodiments. FIG. 3F is a diagrammatic cross-sectional view of multigate device 200 in the X-Z plane along lines D-D' of FIG. 3A constructed according to various embodiments.

Figures 10A, 10B, 10C, 10D:
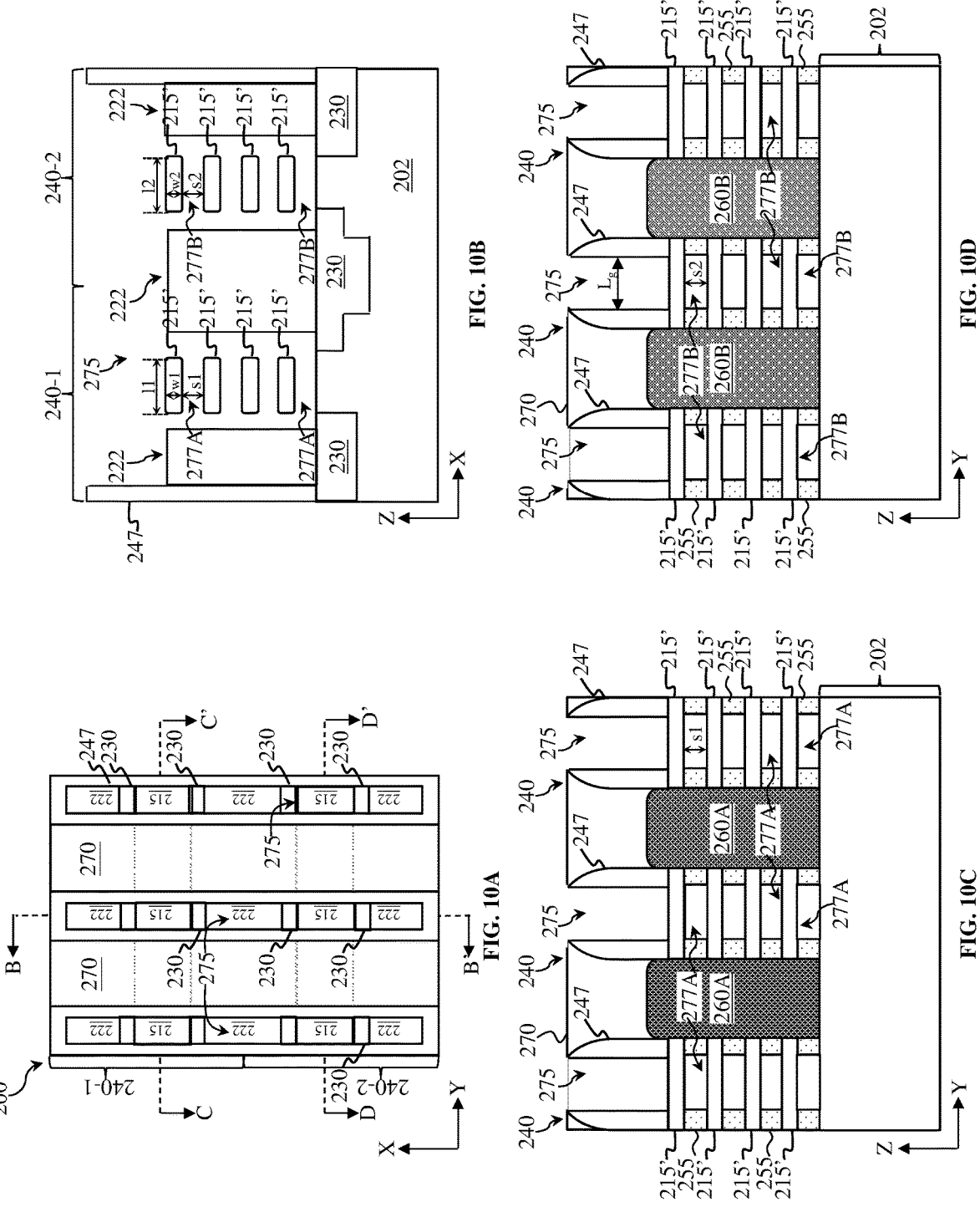
Figure 10E:
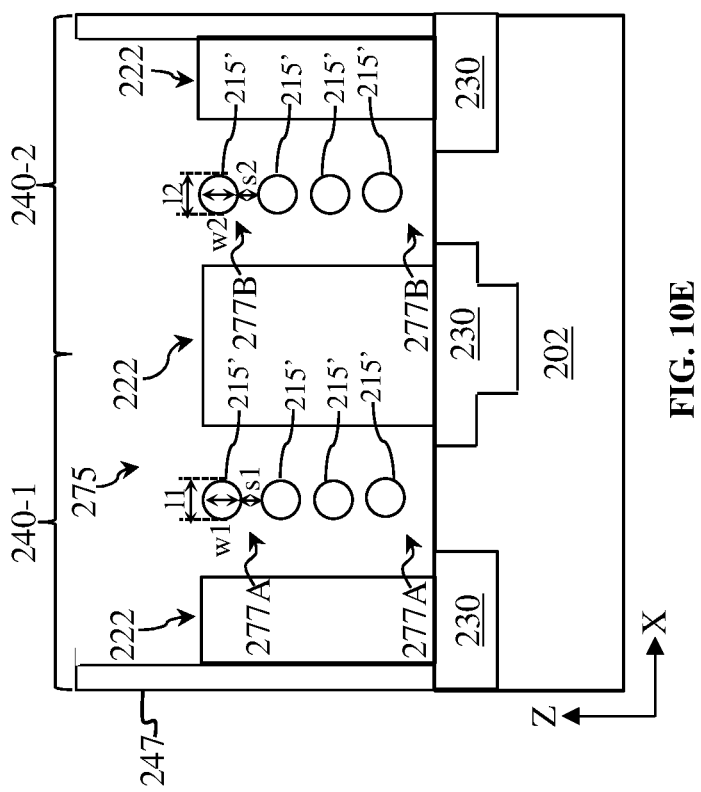
FIG. 10E is a fragmentary diagrammatic view of the multigate device, in portion or entirety according to various aspects of the present disclosure.
Figure 11E:
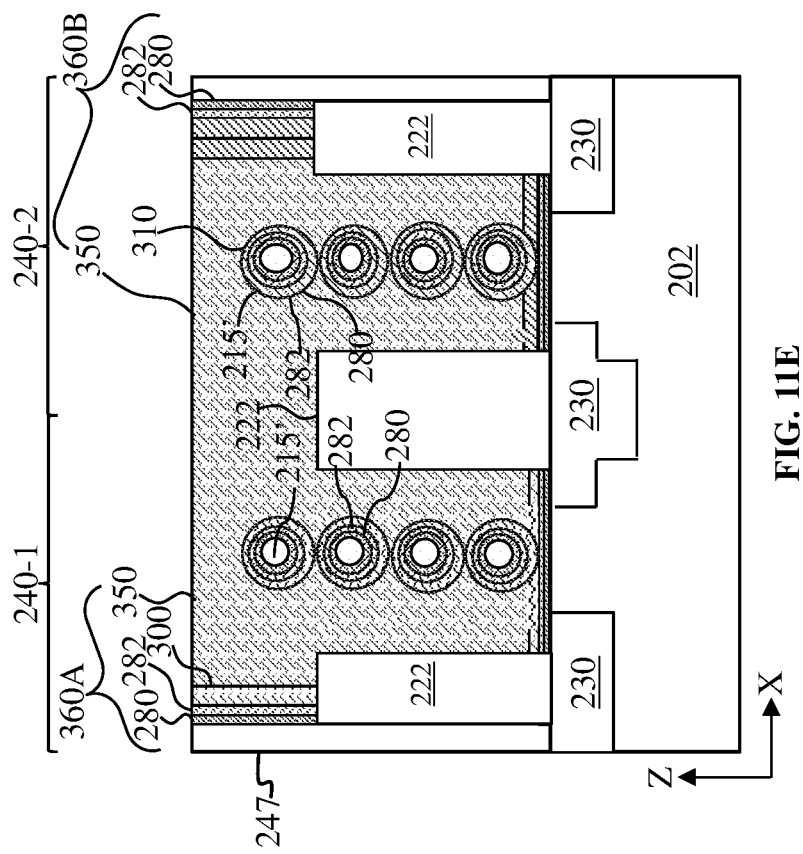
FIG. 11E is a fragmentary diagrammatic view of the multigate device, in portion or entirety according to various aspects of the present disclosure.

FIG. 10E is a fragmentary diagrammatic view of the multigate device 200 in the X-Z plane along lines B-B' of FIG. 10A; in portion or entirety according to various aspects of the present disclosure. FIG. 11E is a diagrammatic cross-sectional view of multigate device 200 in the X-Z plane along lines B-B' of FIG. 11A constructed according to some embodiments.

Multigate device 200 may be included in a microprocessor, a memory, and/or other IC devices. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOS-FETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random-access memory (NVRAM), a static random-access memory (SRAM), a flash memory, an electrically erasable programmable read only memory (EE-PROM), an electrically programmable read-only memory (EPROM), other suitable memory type, or combinations thereof. Various figures have been simplified for the sake of clarity to better understand the inventive concepts of the present disclosure. Additional features can be added in multigate device 200, and some of the features described below can be replaced, modified, or eliminated in other embodiments of multigate device 200. Particularly, the substrate 202 includes a first region for a logic circuit (also referred to as a logic circuit region) and a second region for a SRAM circuit (also referred to as a SRAM circuit region).

Turning to FIGS. 2A-2D, multigate device 200 includes a substrate (e.g., wafer) 202. In the depicted embodiment, substrate 202 includes silicon. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In the depicted embodiment, substrate 202 includes a p-type doped region (referred to hereinafter as a p-well), which can be configured for n-type GAA transistors, and an n-type doped region (referred to hereinafter as an n-well), which can be configured for p-type GAA transistors. N-type doped regions, such as n-well, are doped with n-type dopants, such as phosphorus, arsenic, other n-type dopant, or combinations thereof. P-type doped regions, such as p-well, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 205 is formed over substrate 202, where semiconductor layer stack 205 includes first semiconductor layers 210 and second semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of first semiconductor layers 210 and second semiconductor layers 215. In such embodiments, first semiconductor layers 210 and second semiconductor layers 215 can be referred to as epitaxial layers. In some embodiments, epitaxial growth of first semiconductor layers 210 and second semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of first semiconductor layers 210 is different than a composition of second semiconductor layers 215 to achieve etching selectivity and/or different oxidation rates during subsequent processing. In some embodiments, first semiconductor layers 210 have a first etch rate to an etchant and second semiconductor layers 215 have a second etch rate to the etchant, where the second etch rate is less than the first etch rate. In some embodiments, first semiconductor layers 210 have a first oxidation rate and second semiconductor layers 215 have a second oxidation rate, where the second oxidation rate is less than the first oxidation rate. In the depicted embodiment, first semiconductor layers 210 and second semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where first semiconductor layers 210 include silicon germanium and second semiconductor layers 215 include silicon, a silicon etch rate of semiconductor layers 215 is less than a silicon germanium etch rate of semiconductor layers 210 by the etchant used in the later channel-releasing process. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of multigate device 200. In the depicted embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in multigate device 200 having four channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 215), thickness t2 can be configured to achieve desired thickness of channels of multigate device 200, and both thickness t1 and thickness t2 can be configured to achieve desired performance of multigate device 200. In some embodiments, thickness t1 and thickness t2 are about 1 nm to about 10 nm.

In some embodiments, semiconductor layers 215 may have nonuniform composition along the z-direction so that for applying an etching process to semiconductor layers 215 with desired anisotropic etching, thereby modifying semiconductor layers 215 to have a desired profile at a later fabrication stage. In some embodiments, semiconductor layers 210 include silicon germanium with a substantial uniform composition (such as a uniform germanium concentration $C_{Ge}$) while semiconductor layers 215 also include silicon germanium with germanium concentration nonuniformly distributed along the z-direction (thickness direction). Each of semiconductor layers 215 has the highest germanium concentration $C_{Gmax}$ (atomic percentage) at both the top surface and the bottom surface and the lowest $C_{Gmin}$ in the middle level. The maximum concentration $C_{Gmax}$ is less than the germanium concentration $C_{Ge}$ of the semiconductor layers 210 and the minimum concentration $C_{Gmin}$ is less than $C_{Gmax}$, such as the minimum concentration $C_{Gmin}$ being zero in the present embodiment.

Turning to FIGS. 3A-3F, semiconductor layer stack 205 is patterned to form semiconductor fins 218, and isolation features 230 are formed to be surrounding various semiconductor fins for isolation. Semiconductor fins 218 further include semiconductor fins 218A for n-type transistors in region 202A and semiconductor fins 218B for p-type transistors in region 202B. Only one semiconductor fin 218A and one semiconductor fin 218B are illustrated in FIG. 3A. However, the present disclosure contemplates embodiments where semiconductor fins 218A includes a plurality of semiconductor fins 218A and semiconductor fins 218B includes a plurality of semiconductor fins 218B, for example, depending on a number of n-type GAA transistors and a number of p-type GAA transistors desired for multigate device 200 and/or design requirements of multigate device 200. Fins 218A, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. In the depicted embodiments, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

In the depicted embodiment, the operation to form fins 218A and 218B includes at least two patterning procedures (or processes) and each includes one lithography process and one etching process, resulting in the trenches and isolations features with a stepwise profile. The operation to form isolation features is further described later with reference to FIGS. 12A-12L in detail.

A cladding layer 220 may be formed on the sidewalls of the fins 218A, 218B by a suitable method, such as selective epitaxial growth. The cladding layer 220 may include a semiconductor material similar to that of the first semiconductor layers 210 in composition. In the depicted embodiment, the cladding layer 220 includes silicon germanium. The cladding layer 220 provides paths to etch the first semiconductor layers 210 and is removed with the first semiconductor layers 210 during a channel-release process at later stage (to be described below). The cladding layer 220 may present on the top surface of the fins according to some embodiments.

In some embodiments, dielectric fins 222 may be formed among the fins 218. The dielectric fins 222 are dielectric features of one or more dielectric material. Only one dielectric fin 222 is illustrated in FIG. 3B. More dielectric fins 222 may be present, such as one on left side of the fin 218A and another one on right side of the fin 218B. Dielectric fin 222 may be formed by any suitable method that including deposition. In some embodiments, dielectric fin 222 includes a dielectric stack 222A and a self-aligned cap 222B disposed on the dielectric stack 222A and aligned with the dielectric stack 222A, as illustrated in FIG. 3E. In furtherance of the embodiment, the dielectric fin 222 is formed by a procedure that includes a deposition of one or more dielectric material to fill in the gap between the fins 218; performing a chemical mechanical polishing (CMP) process; selectively etching to recess the deposited dielectric material; depositing another dielectric material and performing another CMP process to form the dielectric stack 222A and the self-aligned cap 222B. In some embodiments, the dielectric fin 222 includes a conformal dielectric layer 222C and a bulk dielectric layer 222D disposed on the conformal dielectric layer 222C, as illustrated in FIG. 3F. In furtherance of the embodiment, the dielectric fin 222 is formed by a procedure that includes a conformal deposition of one or more dielectric material in the gap between the fins 218 and depositing another dielectric material on the conformal dielectric layer 222C to fill in the gap between the fins 218; and performing a CMP process. In some embodiments, the hard mask used to pattern semiconductor stacks 205 may be removed at this stage. Thus, the dielectric fin 222 is extended above the fins 218.

Turning to FIGS. 4A-4D, gate structures 240 are formed over portions of fins 218A, 218B, over dielectric fin 222, and over isolation features 230. Gate structures 240 extend lengthwise in a direction that is different than (e.g., orthogonal to) the lengthwise direction of fins 218A, 218B. For example, gate structures 240 extend substantially parallel to one another along the x-direction, having a length defined in the y-direction, a width defined in the x-direction, and a height defined in the z-direction. Gate structures 240 are disposed on portions of fins 218A, 218B and define source/drain regions 242 and channel regions 244 of fins 218A, 218B. In the X-Z plane, gate structures 240 wrap top surfaces and sidewall surfaces of fins 218A, 218B. In the Y-Z plane, gate structures 240 are disposed over top surfaces of respective channel regions 244 of fins 218A, 218B, such that gate structures 240 interpose respective source/drain regions 242. Each gate structure 240 includes a gate region 240-1 that corresponds with a portion of the respective gate structure 240 that will be configured for an n-type GAA transistor (and thus corresponds with a portion spanning an n-type GAA transistor region) and a gate region 240-2 that corresponds with a portion of the respective gate structure 240 that will be configured for a p-type GAA transistor (and thus corresponds with a portion spanning a p-type GAA transistor region). Gate structures 240 may be configured differently in gate region 240-1 and gate region 240-2, depending on the transistors to be formed on these regions, such as p-type transistors or n-type transistors. For example, each of gate structures 240 spans gate region 240-1 and gate region 240-2 and may be configured differently in gate region 240-1 and gate region 240-2 to optimize performance of the n-type GAA transistors (having n-gate electrodes in gate regions 240-1) and the p-type GAA transistors (having p-gate electrodes in gate regions 240-2). Accordingly, gate regions 240-1 will be referred to as n-type gate regions 240-1 and gate regions 240-2 will be referred to as p-type gate regions 240-2 hereinafter.

In FIGS. 4A-4D, each gate structure 240 includes a dummy gate stack 245. In the depicted embodiment, a width of dummy gate stacks 245 defines a gate length (Lg) of gate structures 240 (here, in the y-direction), where the gate length defines a distance (or length) that current (e.g., carriers, such as electrons or holes) travels between source/drain regions 242 when the n-type GAA transistor and/or the p-type GAA transistor are switched (turned) on. In some embodiments, the gate length is about 5 nm to about 250 nm. Gate length can be tuned to achieve desired operation speeds of the GAA transistors and/or desired packing density of the GAA transistors. For example, when a GAA transistor is switched on, current flows between source/drain regions of the GAA transistor. Increasing the gate length increases a distance required for current to travel between the source/drain regions, increasing a time it takes for the GAA transistor to switch fully on. Conversely, decreasing the gate length decreases the distance required for current to travel between the source/drain regions, decreasing a time it takes for the GAA transistor to switch fully on. Smaller gate lengths provide GAA transistors that switch on/off more quickly, facilitating faster, high speed operations. Smaller gate lengths also facilitate tighter packing density (i.e., more GAA transistors can be fabricated in a given area of an IC chip), increasing a number of functions and applications that can be fabricated on the IC chip. In the depicted embodiment, the gate length of one or more of gate structures 240 is configured to provide GAA transistors having short-length channels. For example, the gate length of GAA transistors is about 5 nm to about 20 nm. In some embodiments, multigate device 200 can include GAA transistors having different gate lengths.

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

In some embodiments, a lightly doped source/drain (LDD) implantation process may be applied to the semiconductor layer stack 205 to form LDD features (not shown) aligned with edges of the dummy gate stacks 245. LDD features are separately formed for n-type GAA transistors and p-type GAA transistors. For example, LDD features for n-type GAA transistors includes n-type dopant, such as phosphorous while LDD features for p-type GAA transistors includes p-type dopant, such as boron. In some embodiments, an etching process may be applied to selectively remove the cladding layer 220 at this stage or after the formation of the gate spacers 247.

Each gate structure 240 further includes gate spacers 247 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set. Note that the workpiece 200 illustrated in FIGS. 4A-4D and subsequent figures includes more dielectric fins 222. It is not intended to be limiting, and more or less dielectric fins 222 may be present according to different embodiments.

Turning to FIGS. 5A-5D, exposed portions of fins 218A, 218B (i.e., source/drain regions 242 of fins 218A, 218B that are not covered by gate structures 240) are at least partially removed to form source/drain trenches (recesses) 250. In the depicted embodiment, an etching process completely removes semiconductor layer stack 205 in source/drain regions 242 of fins 218A, 218B, thereby exposing the substrate portion of fins 218A, 218B in source/drain regions 242 (e.g., p-well 204A and n-well 204B). Source/drain trenches 250 thus have sidewalls defined by remaining portions of semiconductor layer stack 205, which are disposed in channel regions 244 under gate structures 240, and bottoms defined by substrate 202, such as top surfaces of p-well 204A and n-well 204B in source/drain regions 242. In some embodiments, the etching process removes some, but not all, of semiconductor layer stack 205, such that source/drain trenches 250 have bottoms defined by semiconductor layer 210 or semiconductor layer 215 in source/drain regions 242. In some embodiments, the etching process further removes some, but not all, of the substrate portion of fins 218A, 218B, such that source/drain recesses 250 extend below a topmost surface of substrate 202. The etching process can include a dry etching process, a wet etching process, other suitable etching process, or combinations thereof. In some embodiments, the etching process is a multi-step etch process. For example, the etching process may include alternative etchants to separately and alternately remove semiconductor layers 210 and semiconductor layers 215. In some embodiments, parameters of the etching process are configured to selectively etch semiconductor layer stack with minimal (to no) etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask. In some embodiments, the patterned mask layer used to form dummy gate stacks 245 remains and is used as an etch mask to recess the source/drain regions 242.

Turning to FIGS. 6A-6D, inner spacers 255 are formed in channel regions 244 along sidewalls of semiconductor layers 210 by any suitable process. Particularly, the inner spacers 255 are formed to be vertically aligned with gate spacers 247 (and the LDD features if present) to provide isolation and separation between the gate structure and the source/drain features. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and substrate 202 under gate spacers 247. Portions (edges) of semiconductor layers 215 are thus suspended in the channel regions 244 under gate spacers 247. In some embodiments, the gaps extend partially under dummy gate stacks 245. The first etching process is configured to laterally etch (e.g., along the y-direction) semiconductor layers 210, thereby reducing a length of semiconductor layers 210 along the y-direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 202 under gate spacers 247. A second etching process is then performed that selectively etches the spacer layer to form inner spacers 255 as depicted in FIGS. 6A-6D with minimal (to no) etching of semiconductor layers 215, dummy gate stacks 245, and gate spacers 247. In some embodiments, the spacer layer is removed from sidewalls of gate spacers 247, sidewalls of semiconductor layers 215, dummy gate stacks 245, and substrate 202. The spacer layer (and thus inner spacers 255) includes a material that is different than a material of semiconductor layers 215 and a material of gate spacers 247 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Turning to FIGS. 7A-7D, epitaxial source/drain features are formed in source/drain recesses 250. For example, a semiconductor material is epitaxially grown from portions of substrate 202 and semiconductor layers 215 exposed by source/drain recesses 250, forming epitaxial source/drain features 260A in source/drain regions 242 that correspond with n-type GAA transistor regions and epitaxial source/drain features 260B in source/drain regions 242 that correspond with p-type GAA transistor regions. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). Epitaxial source/drain features 260A, 260B are doped with n-type dopants and/or p-type dopants. In some embodiments, for the n-type GAA transistors, epitaxial source/drain features 260A include silicon. Epitaxial source/drain features 260A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 260B include silicon germanium or germanium. P-type epitaxial source/drain features 260B can be doped with boron, other p-type dopant, or combinations thereof (for example, forming Si:Ge:B epitaxial source/drain features). In some embodiments, epitaxial source/drain features 260A and/or epitaxial source/drain features 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions 244. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type GAA transistor regions when forming epitaxial source/drain features 260A in n-type GAA transistor regions and masking n-type GAA transistor regions when forming epitaxial source/drain features 260B in p-type GAA transistor regions.

In some embodiments, the source/drain features 260A and 260B may be engineered to have desired shapes and sizes by tuning the etching process that forms the source/drain recesses 250 and the epitaxial growth to form the source/drain features 260A/260B.

In some embodiments, the deposition (epitaxial growth) chemical in the precursor may include silane ($SiH_4$) or dichlorosilane ($SiH_2Cl_2$) for growing silicon, $GeH_4$ for growing germanium, or both for growing silicon germanium. The precursor also includes chemical for dopant, such as phosphorous-containing chemical for n-type dopant or boron-containing chemical for p-type dopant. In the present embodiment, the precursor for n-type source/drain features 260A includes $SiH_4$ and a phosphorous-containing chemical to form the n-type source/drain features 260A of silicon doped with phosphorous. The precursor for epitaxial growth may additionally include etching chemical to control the epitaxial growth and the profile of the source/drain features. In some embodiments, the etching chemical includes HCl. In some embodiments, the etching chemical includes chlorine-containing chemical, such as HCl or $Cl_2$, or fluorine-containing chemical, such as $SF_6$, or alternatively both chlorine-containing chemical and fluorine-containing chemical.

In some embodiments, the epitaxial growth is designed with a lower deposition/etching (D/E) ratio to achieve a desired source/drain profile, the etching gas in the precursor uses HCl with a flow rate greater than 30000 sccm, or a flow rate ranging between 40000 sccm~30000 sccm. Thus, the epitaxial growth is a bottom-up deposition, thereby forming the source/drain features with a geometry having substantial vertical sidewalls. In some embodiments, the epitaxial growth is designed with a higher ratio D/E to achieve a different profile, the etching gas in the precursor uses HCl with a flow rate less than 10000 sccm, or ranging between 0 sccm~10000 sccm, the epitaxial growth forms the source/drain features with a profile having uneven sidewalls.

Turning to FIGS. 8A-8D, an inter-level dielectric (ILD) layer 270 is formed over isolation features 230, epitaxial source/drain features 260A, 260B, and gate spacers 247, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Acrogel, amorphous fluorinated carbon, Parylene, BCB, SiLK (Dow Chemical, Midland, Michigan), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. In some embodiments, a contact etch-stop layer (CESL) is disposed between ILD layer 270 and isolation features 230, epitaxial source/drain features 260A, 260B, and gate spacers 247. The CESL includes a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed until reaching (exposing) a top portion (or top surface) of dummy gate stacks 245. In some embodiments, the planarization process removes hard mask layers of dummy gate stacks 245 to expose underlying dummy gate electrodes of dummy gate stacks 245, such as polysilicon gate electrode layers.

ILD layer 270 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of p-type GAA transistors and/or n-type GAA transistors), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Turning to FIGS. 9A-9D, dummy gate stacks 245 are removed from gate structures 240 by a suitable etching process, thereby resulting in gate trenches 275 and exposing semiconductor layer stacks 205 of fins 218A, 218B in n-type gate regions 240-1 and p-type gate regions 240-2. The etching process is designed with etchant to selectively remove the dummy gate stacks 245. In the depicted embodiment, an etching process completely removes dummy gate stacks 245 to expose semiconductor layers 215 and semiconductor layers 210 in channel regions 244. The etching process is a dry etching process, a wet etching process, other suitable etching process, or combinations thereof. In some embodiments, the etching process is a multi-step etch process. For example, the etching process may include alternative etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of multigate device 200, such as ILD layer 270, gate spacers 247, isolation features 230, semiconductor layers 215, and semiconductor layers 210. In some embodiments, a lithography process, such as those described herein, is performed to form a patterned mask layer that covers ILD layer 270 and/or gate spacers 247, and the etching process uses the patterned mask layer as an etch mask.

Turning to FIGS. 10A-10E, semiconductor layers 210 of semiconductor layer stack 205 (exposed by gate trenches 275) are selectively removed from channel regions 244, thereby forming suspended semiconductor layers 215 in channel regions 244. In the depicted embodiment, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium (or silicon). In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) to selectively etch semiconductor layers 210.

At least one suspended semiconductor layer 215 is thus exposed in n-type gate regions 240-1 and p-type gate regions 240-2 by gate trenches 275. In the depicted embodiment, each n-type gate region 240-1 and each p-type gate region 240-2 includes four suspended semiconductor layers 215 vertically stacked that will provide four channels through which current will flow between respective epitaxial source/drain features (epitaxial source/drain features 260A or epitaxial source/drain features 260B) during operation of the GAA transistors. Suspended semiconductor layers 215 are thus referred to as channel layers 215' hereinafter. Channel layers 215' in n-type gate regions 240-1 are separated by gaps 277A, and channel layers 215' in p-type gate regions 240-2 are separated by gaps 277B, collectively being referred to as gaps 277. Channel layers 215' in n-type gate regions 240-1 are also separated from substrate 202 by gaps 277A, and channel layers 215' in p-type gate regions 240-2 are also separated by gaps 277B. A spacing s1 is defined between channel layers 215' along the z-direction in n-type gate regions 240-1, and a spacing s2 is defined between channel layers 215' along the z-direction in p-type gate regions 240-2. Spacing s1 and spacing s2 correspond with a width of gaps 277A and gaps 277B, respectively. In the depicted embodiment, spacing s1 is about equal to s2, though the present disclosure contemplates embodiments where spacing s1 is different than spacing s2. In some embodiments, spacing s1 and spacing s2 are both about equal to thickness t1 of semiconductor layers 210. Further, channel layers 215' in n-type gate regions 240-1 have a length l1 along the x-direction and a width w1 along the z-direction, and channel layers 215' in p-type gate regions 240-2 have a length l2 along the x-direction and a width w2 along the z-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215' has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 10A-10D can be referred to as a channel nanowire release process. In some embodiments, after removing semiconductor layers 210, an etching process is performed to modify a profile of channel layers 215' to achieve desired dimensions and/or desired shapes (e.g., cylindrical-shaped (e.g., nanowire), rectangular-shaped (e.g., nanobar), sheet-shaped (e.g., nanosheet, etc., such as illustrated in FIG. 10B). The present disclosure further contemplates embodiments where the channel layers 215' (nanowires, as illustrated in FIG. 10E) have sub-nanometer dimensions depending on design requirements of multigate device 200. In furtherance of the embodiment where the channel layers 215' are nanowires, the length along x-direction and width along x-direction are substantially equal. For example, l1=w1 and l2=w2 with relative difference being less than 10%.

Turning to FIGS. 11A-11E, gate stacks 360A (for n-type transistors) and 360B (for p-type transistors) are formed over multigate device 200. Gate stacks 360A and 360B are collectively referred to as gate stacks 360. The gate stacks 360 are formed in the gate trenches 275, are extended down to wrap around each of the vertically stacked channel layers 215'.

The formation of the gate stacks includes deposition and planarization process, such as CMP. The gate stacks 360A and 360B may be collectively formed or alternatively, separately formed, depending on the type of GAA transistors, such as n-type GAA transistors or p-type GAA transistors. Accordingly, the gate stacks 360A and 360B may have the same compositions or alternatively different compositions, such as different work function metal layers (as described below). Each of the gate stacks 360A and 360B includes a gate dielectric layer and a gate electrode disposed on the gate dielectric layer. In some embodiments, the gate dielectric layer includes an interfacial layer 280 and a high-k dielectric layer disposed on the interfacial layer 280. The gate electrode may include one or more conductive materials, such as a capping layer, a work function metal layer, a blocking layer, a metal fill layer, and/or other proper conductive material layers. In some embodiments, the gate electrode includes a work function layer (such as 300 for the gate stack 360A or 310 for the gate stack 360B) and a metal fill layer 350 disposed on the work function metal layer. The work function layers 300 and 310 may be same or different and may be an n-type work function layer or a p-type work function layer, depending on the types of the corresponding GAA transistors.

In the depicted embodiment, the gate dielectric layer includes an interfacial layer 280 and a high-k dielectric layer 282, where interfacial layer 280 is disposed between the high-k dielectric layer 282 and channel layers 215'. In furtherance of the depicted embodiment, interfacial layer 280 and high-k dielectric layer 282 partially fill gaps 277A between channel layers 215' and between channel layers 215' and substrate 202 in the first gate region 240-1 and partially fill gaps 277B between channel layers 215' and between channel layers 215' and substrate 202 in the second gate region 240-2. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZIO, $ZrO_2$, $ZrSiO_2$, AlO, AlSiO, $Al_2O_3$, TIO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr) $TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

The work function layer (300 or 310) is formed over multigate device 200, particularly over high-k dielectric layer 282. For example, an ALD process conformally deposits the work function layer on high-k dielectric layer 282, such that the work function layer has a substantially uniform thickness and partially fills gate trenches 275. The work function layer can be formed using another suitable deposition process, such as CVD, PVD, HDPCVD, MOCVD, RPCVD, PECVD, LPCVD, ALCVD, APCVD, spin coating, plating, other deposition process, or combinations thereof. For example, the work function layer is disposed along sidewalls, tops, and bottoms of channel layers 215'. A thickness of the work function layer is configured to at least partially fill gaps (277A or 277B) between channel layers 215' and between channel layers 215' and substrate 202 (and, in some embodiments, without filling gate trenches 275 along the gate length direction (here, along the y-direction)). In some embodiments, the work function layer has a thickness of about 1 nm to about 10 nm. In some embodiments, p-type work function layer includes any suitable p-type work function material, such as TIN, TaN, TaSN, Ru, Mo, Al, WN, WCN $ZrSi_2$, $MoSi_2$, $TaSi_2$, $NiSi_2$, other p-type work function material, or combinations thereof. In the depicted embodiment, p-type work function layer includes titanium and nitrogen, such as TiN. In some embodiments, the n-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In the depicted embodiment, n-type work function layer includes aluminum.

A metal fill (or bulk) layer 350 is formed over multigate device 200, particularly over the work function layer 300 in the first gate regions 240-1 and over the work function layer 310 in the second gate regions 240-2. For example, a CVD process or a PVD process deposits metal fill layer 350 such that metal fill layer 350 fills any remaining portion of gate trenches 275, including any remaining portions of gaps (277A or 277B) in the gate regions 240-1 and 240-2. Metal fill layer 350 includes a suitable conductive material, such as Al, W, and/or Cu. Metal fill layer 350 may additionally or collectively include other metals, metal oxides, metal nitrides, other suitable materials, or combinations thereof. Alternatively, metal fill layer 350 is formed using another suitable deposition process, such as ALD, CVD, PVD, HDPCVD, MOCVD, RPCVD, PECVD, LPCVD, ALCVD, APCVD, spin coating, plating, other deposition process, or combinations thereof. In the depicted embodiment, the metal fill layer 350 is formed by PVD to form a seed layer and followed by plating to completely form the metal fill layer.

A planarization process is performed to remove excess gate materials from multigate device 200. For example, a CMP process is performed until a top surface of ILD layer 270 is reached (exposed), such that a top surface of gate structures 240 are substantially planar with a top surface of ILD layer 270 after the CMP process. Accordingly, multigate device 200 includes first GAA transistors having a gate stack 360A wrapping respective channel layers 215', such that gate stack 360A is disposed between respective epitaxial source/drain features 260A, and second GAA transistor having metal gate stacks 360B wrapping respective channel layers 215', such that metal gates 360B are disposed between respective epitaxial source/drain features 260B.

Other embodiments may present. As described above, the channel layers 215' of multigate device 200 may have different structure, such as nanosheet illustrated in FIG. 11B or nanowire, such as illustrated in FIG. 11E. In FIG. 11E, the vertical dimension w and horizontal dimension between source/drain features of the channel layer 215' are substantially equal, such l1=w1 and l2=w2.

Figure 12A:
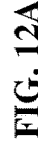
FIGS. 12A-12N are fragmentary diagrammatic views of the multigate device, in portion or entirety according to various aspects of the present disclosure.

Back to FIGS. 3A-3F, the formation of isolation features 230 with stepwise profile is further described with reference to FIGS. 12A-12L, constructed in accordance with some embodiments. FIG. 12A is a top view of the multigate device 200. The multigate device 200 includes a first circuit region 202L for a logic circuit (or a logic circuit region 202L) and a second circuit region 202S for a SRAM circuit (or a SRAM circuit region 202S). The operation to form isolation features 230 includes two patterning processes, each further including one lithography process and one etching process. A first patterning process includes a first lithography process and a first etching process to form semiconductor fins 218 longitudinally oriented along y-direction with first trenches 224I surrounding the semiconductor fins 218. Particularly, the semiconductor fins 218 are disposed in logic circuit region 202L and SRAM circuit region 202S. Due to the first patterning process being applied to both logic and SRAM circuit regions 202L, 202S with substantially equal etching loading effect to logic and SRAM circuit regions 202L, 202S, first trenches 224I have a first depth D1 substantially equal in logic circuit region 202L and SRAM circuit region 202S.

Figure 12B:
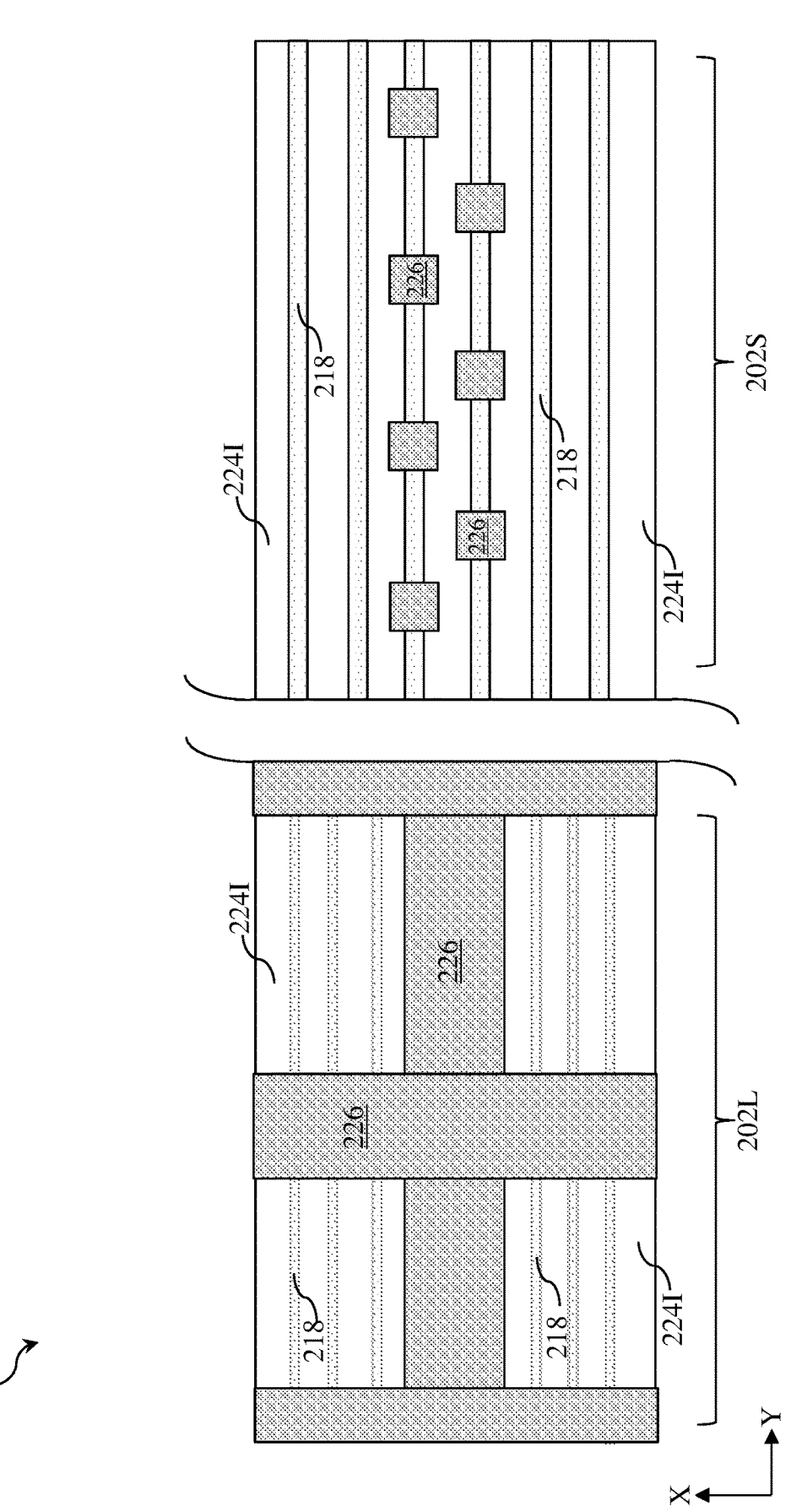
Figure 12C:
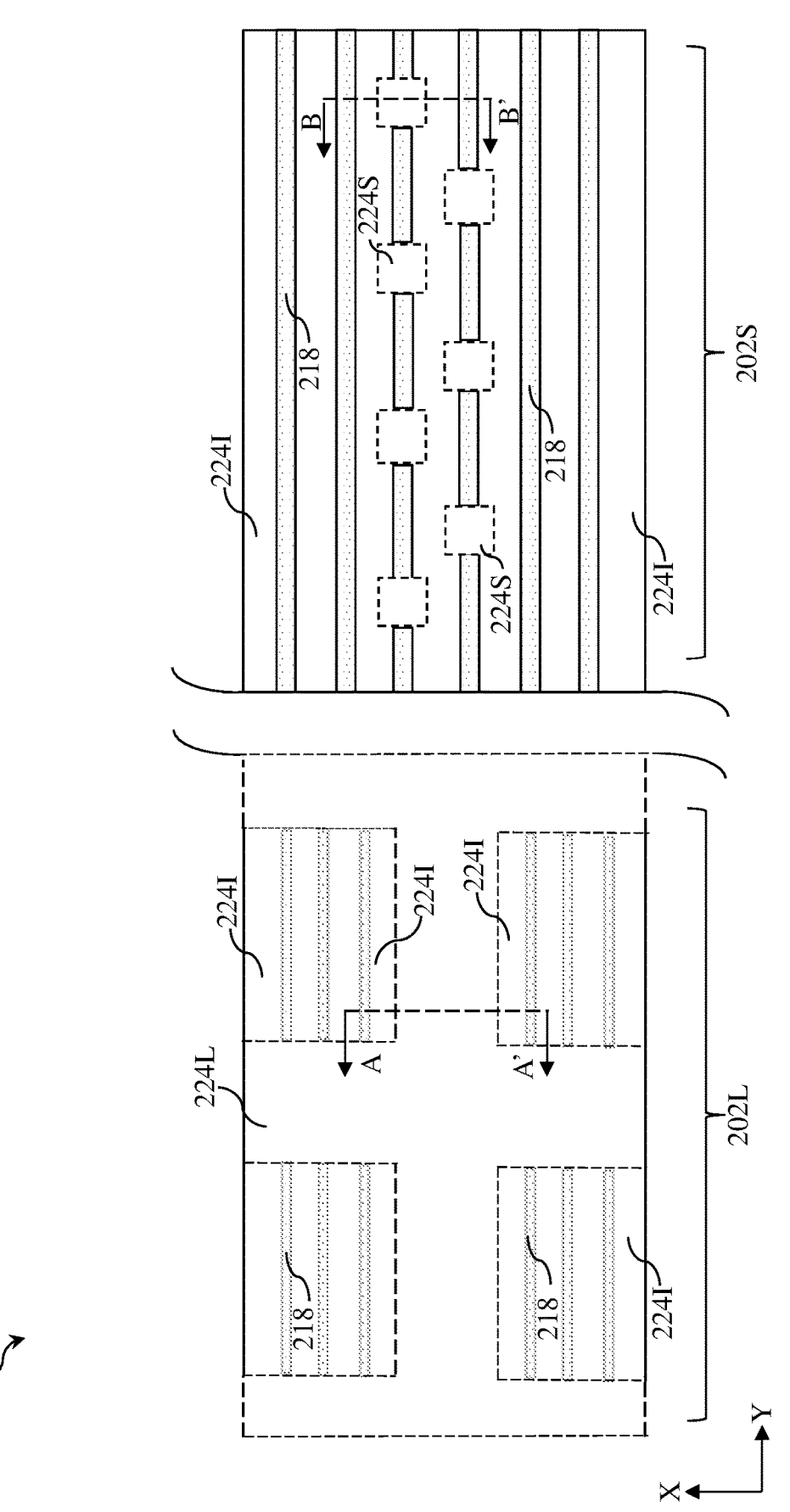

FIGS. 12B and 12C are top views of the multigate device 200 at various fabrication stages, constructed in accordance with some embodiments. A second patterning process includes a second lithography process and a second etching process, as described above, to cut semiconductor fins 218 according to desired circuit and design layout. In the depicted embodiment, a patterned mask is formed with openings 226 to expose areas in which the portions of semiconductor fins 218 are to be removed as illustrated in FIG. 12B. The etch duty ratios in logic circuit region 202L and SRAM circuit region 202S in the second patterning process are designed differently, leading to different etch loading effects. An etch duty ratio is defined as a ratio of an etching area Ae over the considered circuit area A, or Ac/A. Particularly, a first etch duty ratio R1 is defined as a ratio of an etching area A1 in the logic circuit region 202L over the area $A_{logic}$ of the logic circuit region 202L, and a second etch duty ratio R2 is defined as a ratio of an etching area A2 in the SRAM circuit region 202S over the area $A_{SRAM}$ of the SRAM circuit region 202S. In the present embodiment, the R1 is substantially greater than R2 or R1/R2 is greater than 1. In furtherance of the embodiment, R1/R2 ranges between 1.3 and 2.

Figure 12D:
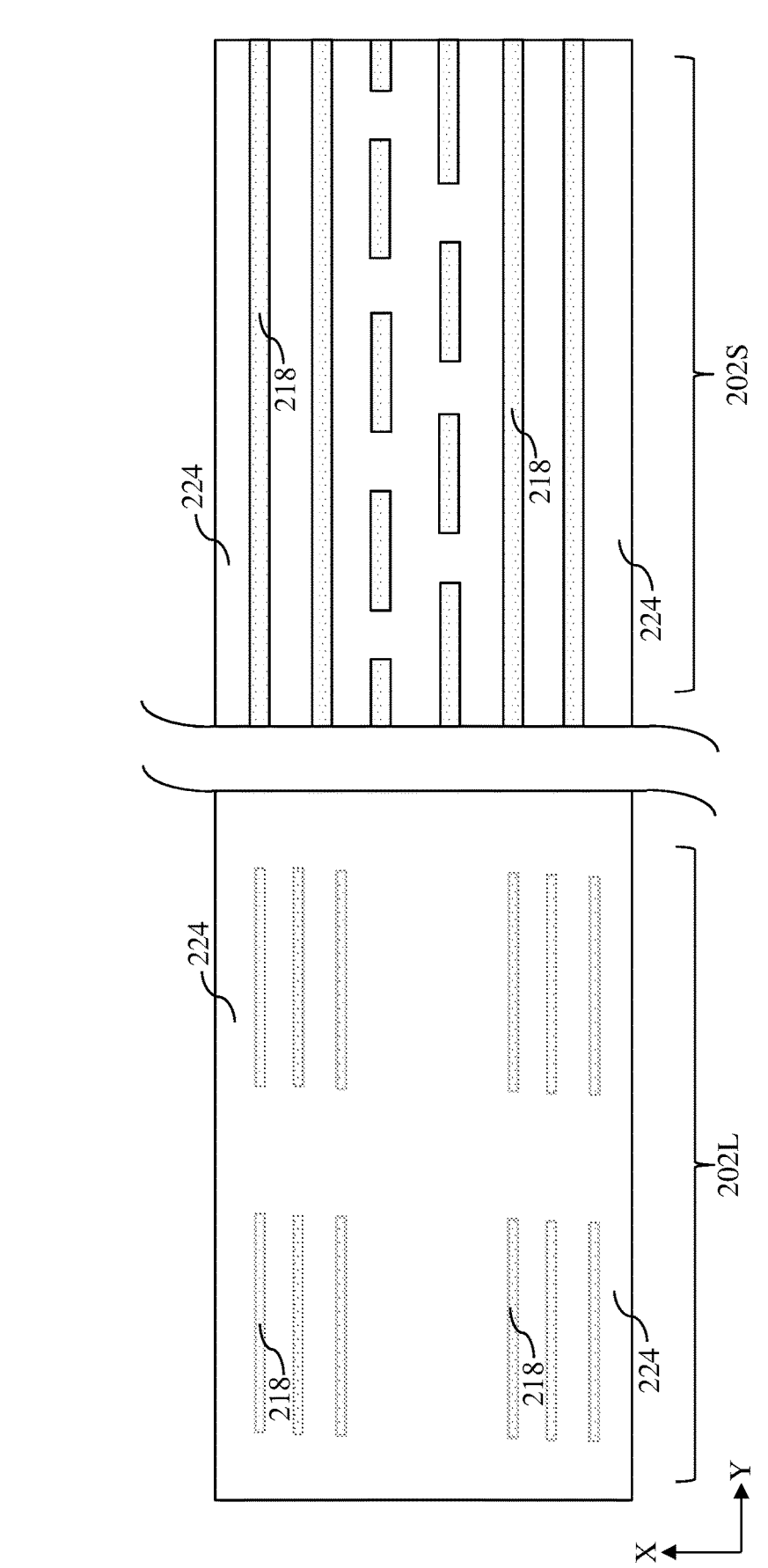

When the second etching process is applied to the workpiece through the openings 226 of the etch mask, trenches are formed on the substrate 202 within logic circuit region 202L and SRAM circuit region 202S with different depths due to different etching loading effects. Particularly, second trenches 224L of a second depth D2 are formed within logic circuit region 202L and third trenches 224S of a third depth D3 are formed within SRAM circuit region 202S, as illustrated in FIG. 12C. First trenches 224I, second trenches 224L and third trenches 224S constitute a trench structure with respective trench depths and are collectively referred to as deep trenches 224, as illustrated in FIG. 12D. In the depicted embodiment, those trenches 224 are deep trenches since they are substantially deeper than shallow trenches. Shallow trenches usually have a depth about 100 nm or less while the disclosed deep trenches have depths substantially greater than 100 nm, such as 160 nm or greater. The deep trenches are employed to enhance isolation by the corresponding isolation features 230. If the trenches are not deep enough, isolation effect is not sufficient. However, if the trenches are too deep, device resistance in logic circuit region 202L is increased and may lead to open issue. Accordingly, the depths of the deep trenches are designed to a proper range, such as a range between 160 nm and 200 nm. Deep trenches also further enhance the etch loading effect, making the difference between second depth D2 and third depth D3 increased, which is further described below.

Figure 12F:
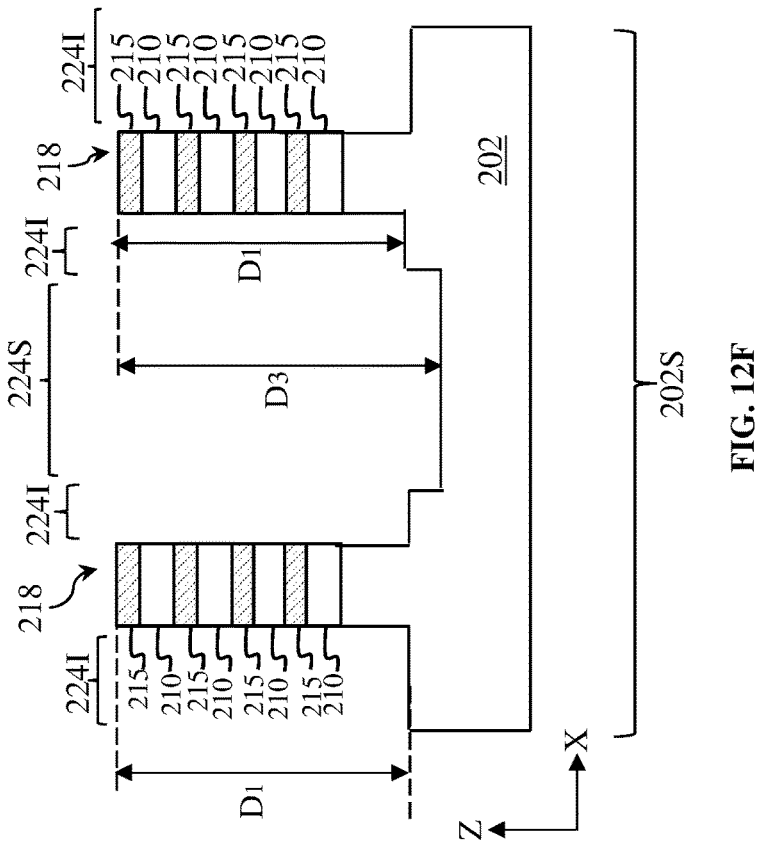
Figure 12E:
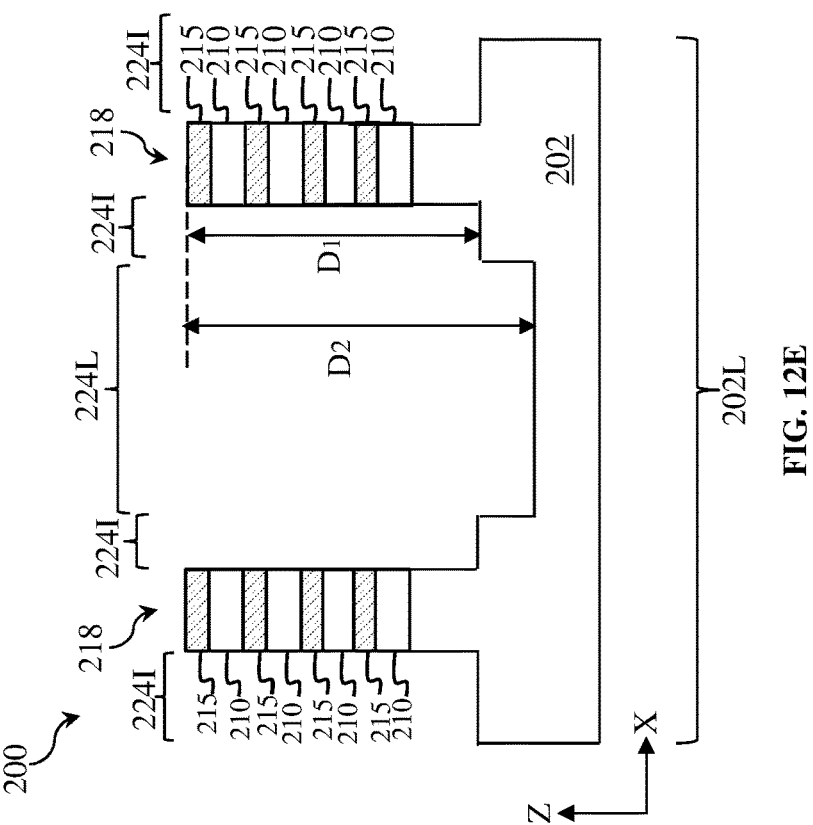

FIGS. 12E and 12F are sectional views of the multigate device 200, in portions, cut along the dashed lines AA' and BB' of FIG. 12C, respectively, according to some embodiments. Logic circuit region 202L include first trenches 224I of the first depth D1 and second trenches 224L of the second depth D2 as illustrated in FIG. 12E, and SRAM circuit region 202S include first trenches 224I of the first depth D1 and third trenches 224S of the third depth D3 being less than D2 as illustrated in FIG. 12F. In some embodiments, a ratio D2/D3 ranges between 1.2 and 1.6.

Figures 12G, 12H:
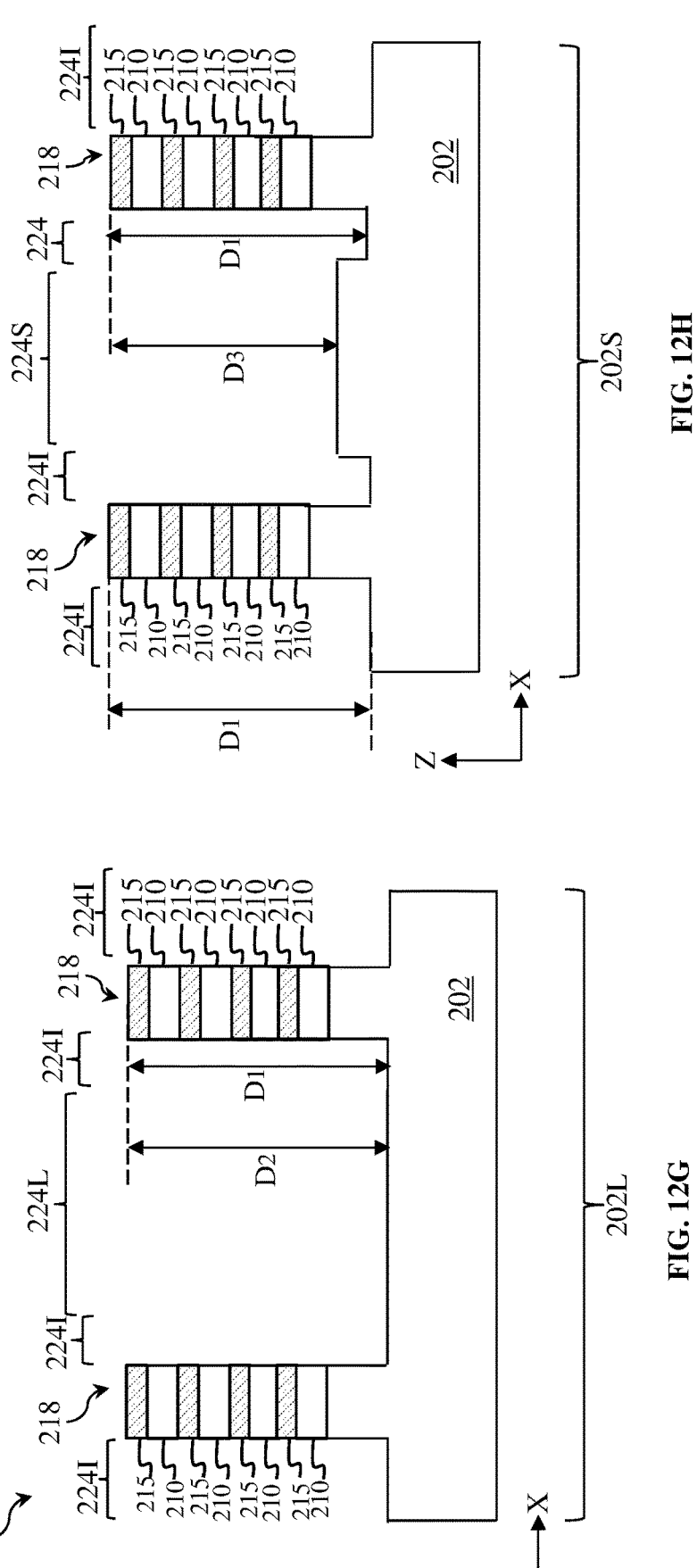
Figures 12I, 12J:
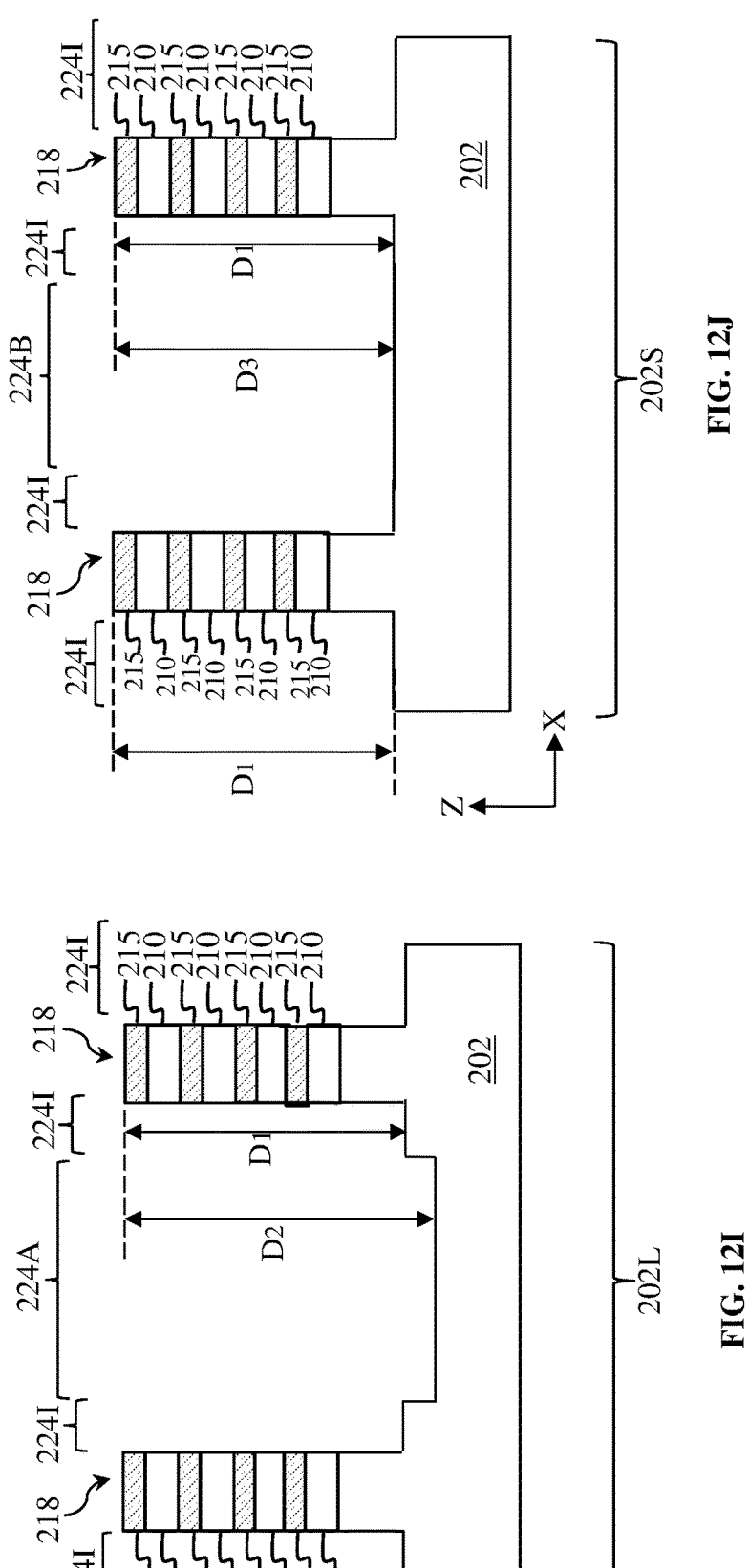

FIGS. 12G and 12H are sectional views of the multigate device 200, in portions, cut along the dashed lines AA' and BB' of FIG. 12C, respectively, according to some other embodiments. FIGS. 12I and 12J are sectional views of the multigate device 200, in portions, cut along the dashed lines AA' and BB' of FIG. 12C, respectively, according to yet some other embodiments. The relationships of first depth D1 to second depth D2 and third depth D3 depend on processing details and other factors in considerations. In some embodiments, the second etching process is applied to the workpiece and continues until the second depth D2 is equal to the first depth D1 as illustrated in FIGS. 12G and 12H. In this case, D2 is equal to D1 and D3 is less than D1. In some embodiments, the second etching process is applied to the workpiece and continues until the third depth D3 is equal to the first depth D1 as illustrated in FIGS. 12I and 12J. In this case, D3 is equal to D1 and D2 is greater than D1.

Figure 12L:
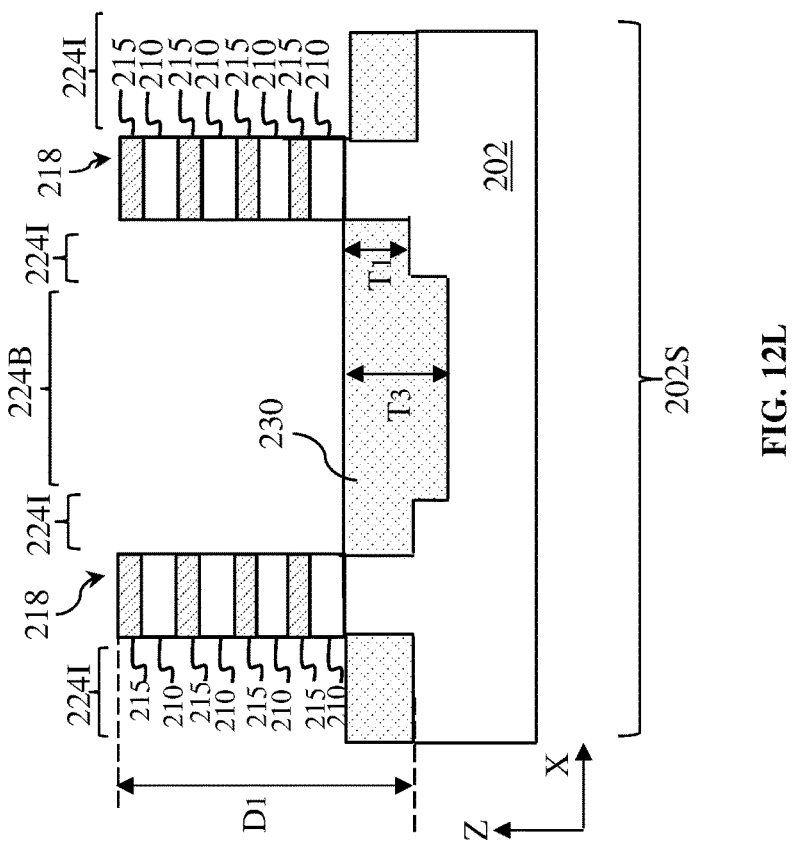
Figure 12K:
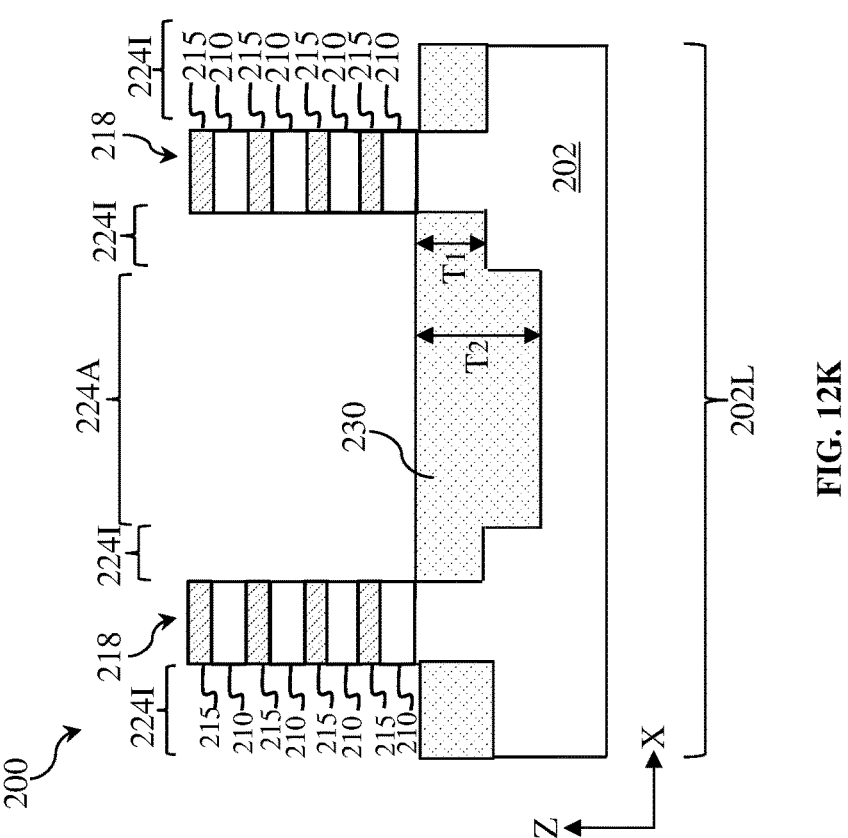

Thereafter, isolation features (or DTI features) 230 are formed by a suitable procedure that includes deposition to fill trenches with one or more dielectric material; performing a CMP process to planarize the top surface; and performing a selective etch process to recess DTI features 230. After the formation of DTI features 230, the semiconductor fins 218 are extruded above the top surfaces of DTI features 230, as illustrated in FIGS. 12K and 12L. FIGS. 12K and 12L are sectional views of the multigate device 200, in portions, similar to FIGS. 12G and 12H, respectively but after the formation of DTI features 230, constructed according to some other embodiments. Trenches 224 are filled with insulator material (for example, by using a CVD process or a spin-on glass process). In some embodiments, DTI features include a multi-layer structure that fills the trenches, such as a silicon nitride comprising layer disposed over a thermal oxide comprising liner layer. In another example, DTI features include a dielectric layer disposed over a doped liner layer (including, for example, boron silicate glass (BSG) or phosphosilicate glass (PSG)). In yet another example, DTI features include a bulk dielectric layer disposed over a liner dielectric layer, where the bulk dielectric layer and the liner dielectric layer include materials depending on design requirements.

Figures 12M, 12N:
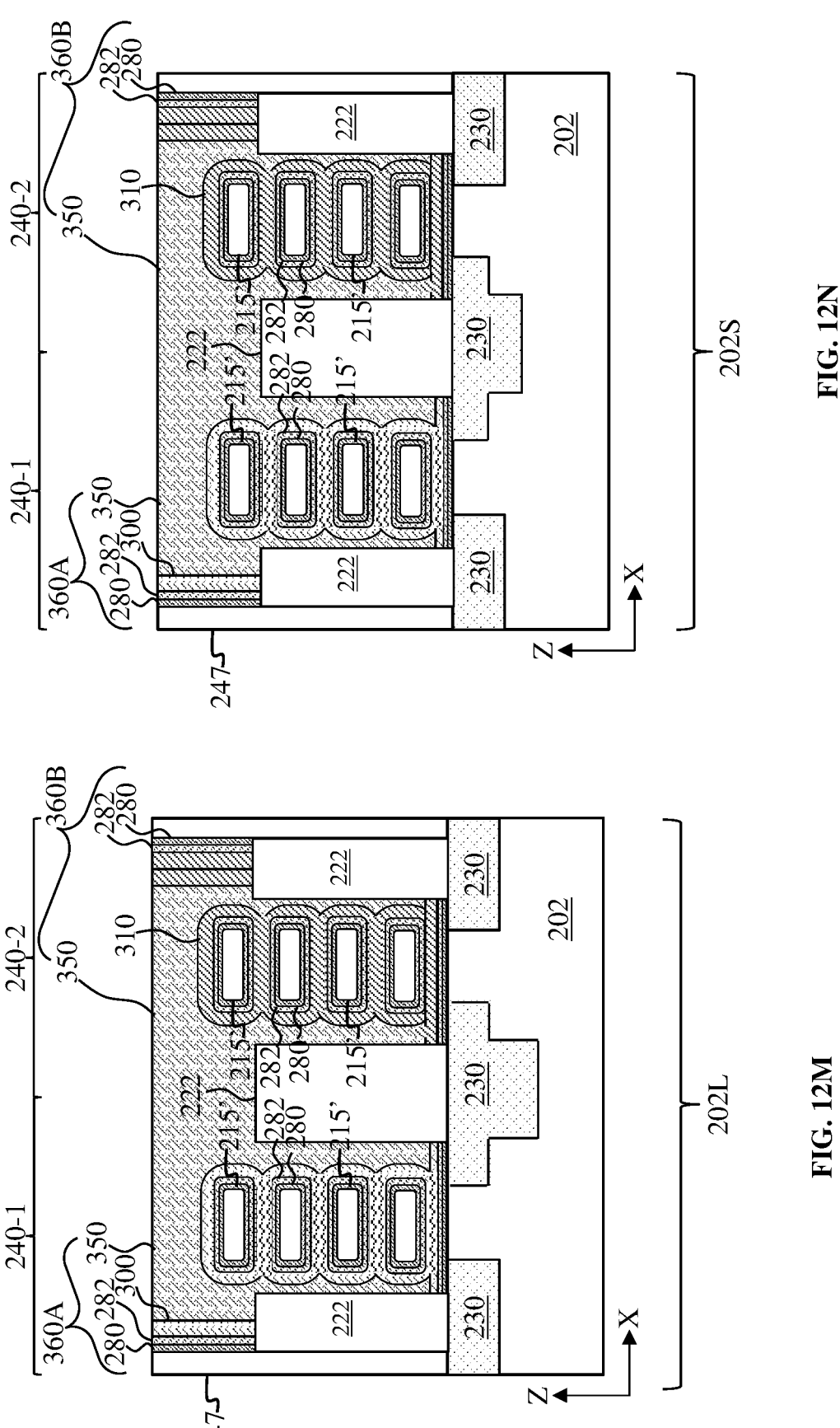

FIGS. 12M and 12N are sectional views of the multigate device 200 at different fabrication stage, in portions, cut along the dashed lines AA' and BB' of FIG. 12C, respectively, according to some other embodiments. FIGS. 12M and 12N are similar to FIGS. 12K and 12L but include formed devices, such as GAA transistors in logic and SRAM circuit regions 202L, 202S.

Isolation features 230 are formed over and/or in substrate 202 to isolate various regions, such as various device regions, of multigate device 200. For example, isolation features 230 surround a bottom portion of fins 218, such that isolation features 230 separate and isolate fins 218 from each other. In the depicted embodiment, isolation features 230 surround the substrate portion of fins 218 and partially surround the semiconductor layer stack portion of fins 218 (e.g., a portion of bottommost semiconductor layer 210). However, the present disclosure contemplates different configurations of isolation features 230 relative to fins 218. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 include proper isolation structures, such as deep trench isolation (DTI) structures that define and electrically isolate fins 218 from other active device regions (such as fins) and/or passive device regions.

Such formed DTI features 230 include a stepwise profile. Furthermore, the top surface of DTI features 230 is planar and a bottom surface of DTI features 230 is uneven or stepwise. Especially, DTI features 230 include first portions of a first thickness T1 within first trenches 224I, second portions of a second thickness T2 within second trenches 224A, and third portions of a third thickness T3 within third trenches 224B. The third thickness T3 is less than the second thickness T2. In the depicted embodiment, a ratio T3/T2 is about 0.3, such as ranging between 0.2 and 0.4.

By implementing the disclosed structure and the method making the same, isolation features 230 include DTI features with a stepwise profile. DTI features provide better isolation to various devices, especially GAA transistors in the logic circuit region. Different thicknesses of the isolation structure in logic and SRAM circuit regions also tailor the isolation structure for respective devices with optimized performances. Double patterning provides enhanced patterning resolution for fin active regions, which is more demanding for GAA transistors with reduced feature sizes. Furthermore, the double patterning with different etch duty ratios can achieve desired isolation profile with at least three thicknesses without utilizing three or more patterning processes, which reduces the fabrication cost.

Back to FIGS. 11A-11E, fabrication can proceed to continue fabrication of multigate device 200. For example, various contacts can be formed to facilitate operation of the n-type GAA transistors and the p-type GAA transistors. For example, one or more ILD layers, similar to ILD layer 270, and/or CESL layers can be formed over substrate 202 (in particular, over ILD layer 270 and gate structures 240). Contacts can then be formed in ILD layer 270 and/or ILD layers disposed over ILD layer 270. For example, contacts are respectively electrically and/or physically coupled with gate structures 240 and contacts are respectively electrically and/or physically coupled to source/drain regions of the n-type GAA transistors and the p-type GAA transistors (particularly, epitaxial source/drain features 260A, 260B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of the MLI feature described above.

Other fabrication processes may be applied to the workpiece 200 and may implemented before, during, or after the processes described above, such as various processing steps to form an interconnect structure over the GAA transistors from the frontside of substrate 202 to electrically connects various circuit components including the first GAA transistors. The interconnect structure includes metal lines distributed in multiple metal layers (such as 1st metal layer, 2nd metal layer, 3rd metal layer, and etc. from the bottom up to the top metal layer) to provide horizontal routing and contact features (between the substrate and the first metal layer, and via features (between the metal layers) to provide vertical routing. The multigate device 200 also includes other components, such as other conductive features (such as redistribution layer or RDL), passivation layer(s) to provide sealing effect, and/or bonding structures to provide an interface between the multigate device 200 and a circuit board (such as a printed circuit board) to be formed on the interconnect structure.

In some embodiments, the source/drain features may be formed by other suitable method. For example, the method includes first etching to recess the source/drain regions; a deposition process to deposit one or more sacrificial material layers on sidewalls of the dielectric fins; and epitaxially growth with one or more semiconductor material. The method further includes second etching to remove the deposited sacrificial material layer leaving airgaps between the epitaxial grown source/drain feature and the adjacent dielectric fin. The deposition is designed to form the sacrificial layer with desired shape, such that the final S/D feature has a bar or lollipop like shape. For example, the deposition may include one or more deposition process controlled to have respective deposition characteristics, such as one with conformal deposition (such as atomic layer deposition), another one with more directional deposition (such as bottom-up deposition, or plasma deposition with higher bias power), and another one with more lateral deposition. In some embodiments, the deposited layer is trimmed to achieve the desired shape by a suitable process, such as performing tilted plasma treatment to the upper portions of the deposited dielectric layer, and then another etching process to partially remove the lower portions of the deposited dielectric layer.

The present disclosure provides multigate device and method making the same for many different embodiments. An exemplary multigate device includes deep trench isolation features with a stepwise profile formed by double patterning while the second patterning include different etch duty ratios in logic and SRAM circuit regions. Such formed DTI features include a stepwise profile, in which portions of isolation features formed by the second patterning in logic and SRAM circuit regions have different thicknesses. Furthermore, the top surface of DTI features is planar, and a bottom surface of DTI features is uneven or stepwise. Especially, DTI features include first portions of a first thickness T1 within first trenches 224I, second portions of a second thickness T2 within second trenches 224A, and third portions of a third thickness T3 within third trenches 224B. The third thickness T3 is less than the second thickness T2. In the depicted embodiment, a ratio T3/T2 is about 0.3, such as ranging between 0.2 and 0.4.

By implementing the disclosed device structure and the method making the same in various embodiments, some of advantages described below may present. However, it is understood that different embodiments disclosed herein offer different advantages and that no particular advantage is necessarily required in all embodiments. As one example, DTI features provide better isolation to various devices, especially GAA transistors in the logic circuit region. Different thicknesses of the isolation structure in logic and SRAM circuit regions also tailor the isolation structure for respective devices with optimized performances in consideration of leakage, current, and quality/reliability issues. Double patterning provides enhanced patterning resolution for fin active regions, which is more demanding for GAA transistors with reduced feature sizes. Furthermore, the double patterning with different etch duty ratios can achieve desired isolation profile with at least three thicknesses without utilizing three or more patterning processes, which reduces the fabrication cost.

In one example aspect, the present disclosure provides a method of semiconductor fabrication. The method includes providing a substrate including a first circuit region and a second circuit region; forming a semiconductor stack on the substrate, wherein the semiconductor stack includes first semiconductor layers of a first composition and second semiconductor layers of a second composition alternatively stacked on the substrate; performing a first patterning process to the semiconductor stack and the substrate to form first trenches having a first depth; and performing a second patterning process to the semiconductor stack and the substrate, thereby forming second trenches of a second depth in the first circuit region and third trenches of a third depth in the second circuit region, the third depth being less than the second depth.

Another one aspect of the present disclosure pertains to a method of semiconductor fabrication. The method includes providing a substrate including a logic circuit region and a static random-access memory (SRAM) circuit region; forming a semiconductor stack on the substrate, wherein the semiconductor stack includes first semiconductor layers of a first composition and second semiconductor layers of a second composition alternatively stacked on the substrate; performing a first patterning process to the semiconductor stack and the substrate to form first trenches in the logic circuit region and the SRAM circuit region, the first trenches having a first depth; and performing a second patterning process to the semiconductor stack and the substrate to form second trenches of a second depth in the logic circuit region and third trenches of a third depth in the SRAM circuit region. The second patterning process includes a first etch duty ratio in the logic circuit region and a second etch duty ratio in the SRAM circuit region. The second etch duty ratio is less than the first etch duty ratio. The third depth is less than the second depth.

Yet another aspect of the present disclosure pertains to a semiconductor structure. The semiconductor structure includes a substrate including a logic circuit region and a SRAM circuit region; fin active regions in the logic circuit region and the SRAM circuit region, wherein each of the fin active regions includes multiple channels vertically stacked on the substrate; deep trench isolation (DTI) features surrounding the fin active regions, wherein the DTI features includes first portions of a first thickness in the logic and SRAM circuit regions, second portions of a second thickness in the logic circuit region, and third portions of a third thickness in the SRAM circuit region, the third thickness being less than the second thickness; gate stacks disposed on the fin active regions, wrapping around each of the multiple channels of a corresponding one of the fin active regions; and source/drain (S/D) features formed the fin active regions, each pair of the S/D features being interposed by a corresponding one of the gate stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing a substrate including a first circuit region and a second circuit region;

forming a semiconductor stack on the substrate, wherein the semiconductor stack includes first semiconductor layers of a first semiconductor composition and second semiconductor layers of a second semiconductor composition alternatively stacked on the substrate;

performing a first patterning process including a first etching process to the semiconductor stack and the substrate to form first trenches having a first depth, wherein the first trenches include a first subset in the first circuit region and a second subset in the second circuit region; and performing a second patterning process to the semiconductor stack and the substrate, wherein the second patterning process includes forming a patterned mask with first openings and second openings such that the first subset of the first trenches is vertically overlapped with and is partially exposed in the first openings and the second subset of the first trenches is vertically overlapped with and is partially exposed in the second openings, and performing a second etching process through the first and second openings, wherein the second etching process forms second trenches of a second depth in the first circuit region and third trenches of a third depth in the second circuit region, the third depth being less than the second depth.

2. The method of claim 1, wherein a first etching duty ratio is defined as a first area of the first openings over an area of the first circuit region;

a second etching duty ratio is defined as a second area of the second openings over an area of the second circuit region; and the performing of the second etching process through the first and second openings includes performing the second etching process through the first and second openings with the first etching duty ratio being greater than the second etching duty ratio.

3. The method of claim 1, wherein the performing of the second patterning process includes performing the second patterning process until the second depth is equal to the first depth and the third depth is less than the first depth.

4. The method of claim 1, wherein the performing of the second patterning process includes performing the second patterning process until the third depth is equal to the first depth and the second depth is greater than the first depth.

5. The method of claim 1, further comprising:

forming deep trench isolation (DTI) features in the first, second and third trenches, thereby defining active regions surrounded by the DTI features;

forming a dummy gate stack on the active regions;

forming source/drain (S/D) features on the active regions;

removing the dummy gate stacks, resulting in gate trenches in an interlayer dielectric (ILD) layer;

performing a third etching process in the gate trench to selectively remove the first semiconductor layers; and forming gate stacks in the gate trenches, each of the gate stacks wrapping around each of the second semiconductor layers.

6. The method of claim 5, wherein the forming DTI features in the first, second and third trenches includes filling a dielectric material in the first, second and third trenches to form first, second and third DTI features in the first, second and third trenches, respectively;

performing a chemical mechanical polishing process to the first, second and third DTI features; and performing a fourth etching process to recess the first, second and third DTI features such that active regions are extruded above the first, second and third DTI features.

7. The method of claim 6, wherein the first DTI features include a first height H1;

the second DTI features include a second height H2;

the third DTI features include a third height H3; and the second height H2 is greater than the third height H3.

8. The method of claim 7, wherein a ratio H2/H3 ranges between 0.2 and 0.4.

9. The method of claim 1, wherein the first circuit region includes a logic circuit; and the second circuit region includes a static random-access memory (SRAM) circuit.

10. The method of claim 9, wherein the performing of the second patterning process includes etching first areas in the first circuit region and second areas in the second circuit region;

the first areas over the first circuit region defines a first etch duty ratio and the second areas over the second circuit region defines a second etch duty ratio; and the second etch duty ratio is less than the first etch duty ratio.

11. The method of claim 1, wherein each of the first semiconductor layers includes a silicon layer and each of the second semiconductor layers includes a silicon germanium layer.

12. The method of claim 1, wherein the performing of the first patterning process to the semiconductor stack and the substrate includes forming the first trenches in a logic circuit region and a static random-access memory (SRAM) circuit region; and the performing of the second patterning process to the semiconductor stack and the substrate includes forming the second trenches in the logic circuit region and the third trenches in the SRAM circuit region.

13. The method of claim 6, further comprising:

forming a dielectric stack on first DTI features, wherein the dielectric stack is interposed between adjacent two of the active regions, wherein the forming of the dielectric stack further includes:

depositing a first dielectric material layer on the first DTI features;

performing a first chemical mechanical polishing (CMP) process to the first dielectric material layer;

performing a fifth etching process to the first dielectric material layer to recess thereof;

depositing a second dielectric material layer on the first dielectric material layer; and performing a second CMP process to the second dielectric material layer.

14. A method, comprising:

providing a substrate including a first circuit region and a second circuit region;

forming a semiconductor stack on the substrate, wherein the semiconductor stack includes first semiconductor layers of a first composition and second semiconductor layers of a second composition alternatively stacked on the substrate;

performing a first patterning process including a first etching process to the semiconductor stack and the substrate to form first trenches having a first depth, wherein the first trenches include a first subset within the first circuit region and a second subset within the second circuit region;

performing a second patterning process including a second etching process to the semiconductor stack and the substrate, wherein the second patterning process includes forming a patterned mask with first openings and second openings such that the first subset of the first trenches is vertically overlapped with and is partially exposed in the first openings and the second subset of the first trenches is vertically overlapped with and is partially exposed in the second openings, and performing a second etching process through the first and second openings, wherein the second etching process forms second trenches of a second depth in the first circuit region and third trenches of a third depth in the second circuit region, the third depth being less than the second depth;

forming a deep trench isolation (DTI) structure in the first, second and third trenches; and forming a dielectric stack on the DTI structure, wherein the dielectric stack includes a first dielectric feature and a second dielectric feature vertically stacked and contacting each other wherein the forming of the dielectric stack further includes depositing a first dielectric material layer on the DTI structure, performing a first chemical mechanical polishing (CMP) process to the first dielectric material layer, performing a third etching process to the first dielectric material layer to recess thereof, depositing a second dielectric material layer on the first dielectric material layer, and performing a second CMP process to the second dielectric material layer, wherein the second patterning process includes a first etch duty ratio in the first circuit region and a second etch duty ratio in the second circuit region, and the second etch duty ratio is less than the first etch duty ratio.

15. The method of claim 14, wherein the performing of the second patterning process includes performing the second patterning process until the second depth is equal to the first depth and the third depth is less than the first depth.

16. The method of claim 14, further comprising:

forming a dummy gate stack on the active regions;

forming source/drain (S/D) features on the active regions;

removing the dummy gate stacks, resulting in gate trenches in an interlayer dielectric (ILD) layer;

performing an etching process in the gate trench to selectively remove the first semiconductor layers; and forming gate stacks in the gate trenches, each of the gate stacks wrapping around each of the second semiconductor layers.

17. The method of claim 16, wherein the forming of the DTI structure in the first, second and third trenches includes filling a dielectric material in the first, second and third trenches to form first, second and third DTI features in the first, second and third trenches, respectively; and recessing the first, second and third DTI features such that the active regions are extruded above the first, second and third DTI features, wherein the first DTI features include a first height H1;

the second DTI features include a second height H2;

the third DTI features include a third height H3; and the second height H2 is greater than the third height H3.

18. A method, comprising:

providing a substrate including a first circuit region and a second circuit region;

forming a semiconductor stack on the substrate, wherein the semiconductor stack includes first semiconductor layers of a first composition and second semiconductor layers of a second composition alternatively stacked on the substrate;

performing a first patterning process including a first etching process to the semiconductor stack and the substrate to form first trenches having a first depth, a first semiconductor fin, and a second semiconductor fin, wherein the first trenches include a first subset in the first circuit region and a second subset in the second circuit region;

performing a second patterning process including a second etching process to the semiconductor stack and the substrate, wherein the second patterning process includes forming a patterned mask with first openings and second openings such that the first subset of the first trenches is vertically overlapped with and is partially exposed in the first openings and the second subset of the first trenches is vertically overlapped with and is partially exposed in the second openings, and performing a second etching process through the first and second openings, wherein the second etching process forms second trenches of a second depth in the first circuit region and third trenches of a third depth in the second circuit region, the third depth being less than the second depth;

forming first, second and third deep trench isolation (DTI) features in the first, second and third trenches, respectively, thereby defining active regions surrounded by the first, second and third DTI features;

forming a cladding layer of a semiconductor material on sidewalls of the first and second semiconductor fins;

forming a dielectric stack on the first DTI features and interposed between the first and second semiconductor fins, wherein the dielectric stack includes a first dielectric feature, and a second dielectric feature vertically aligned with and contacting a top surface of the first dielectric feature, and wherein the dielectric stack contacts sidewalls of the cladding layer;

forming a dummy gate stack on the active regions;

forming source/drain (S/D) features on the active regions;

removing the dummy gate stacks, resulting in gate trenches in an interlayer dielectric (ILD) layer;

performing an etching process in the gate trench to selectively remove the first semiconductor layers; and forming gate stacks in the gate trenches, each of the gate stacks wrapping around each of the second semiconductor layers, wherein the second patterning process includes a first etch duty ratio in the first circuit region and a second etch duty ratio in the second circuit region, and the second etch duty ratio is less than the first etch duty ratio.

19. The method of claim 18, wherein the forming of the dielectric stack between the first and second semiconductor fins further includes depositing a first dielectric material layer on the first DTI features;

performing a first chemical mechanical polishing (CMP) process to the first dielectric material layer;

performing a third etching process to the first dielectric material layer to recess thereof;

depositing a second dielectric material layer on the first dielectric material layer; and performing a second CMP process to the second dielectric material layer.

20. The method of claim 18, wherein the first circuit region includes a logic circuit;

the second circuit region includes a static random-access memory (SRAM) circuit;

the first DTI features include a first height H1;

the second DTI features include a second height H2;

the third DTI features include a third height H3; and the second height H2 is greater than the third height H3.

* * * * *